(12) United States Patent
Ooishi et al.

(10) Patent No.: US 7,394,685 B2
(45) Date of Patent: Jul. 1, 2008

(54) NONVOLATILE MEMORY DEVICE WITH WRITE ERROR SUPPRESSED IN READING DATA

(75) Inventors: Tsukasa Ooishi, Tokyo (JP); Hideto Hidaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 97 days.

(21) Appl. No.: 11/582,983

(22) Filed: Oct. 19, 2006

(65) Prior Publication Data

US 2007/0091671 A1    Apr. 26, 2007

(30) Foreign Application Priority Data

Oct. 19, 2005   (JP) .............................. 2005-304494

(51) Int. Cl.
*G11C 11/14*   (2006.01)
(52) U.S. Cl. ........................................ 365/171; 365/173
(58) Field of Classification Search ................ 365/171, 365/173, 158
See application file for complete search history.

(56) References Cited

U.S. PATENT DOCUMENTS 6,714,444 B2   3/2004   Huai et al.
6,788,568 B2 * 9/2004  Hidaka ........................ 365/158
6,839,272 B2 * 1/2005  Ooishi ........................ 365/171
6,950,335 B2 * 9/2005  Dieny et al. ................. 365/171

FOREIGN PATENT DOCUMENTS

| JP | 2004-111904 A | 4/2004 |
| JP | 2005-11907 A  | 1/2005 |
| JP | 2005-92912 A  | 4/2005 |

OTHER PUBLICATIONS

Stuart S.P. Parkin, et al., "Giant tunneling magnetoresistance at room temperature with MgO (100) tunnel barriers," Nature Materials, Oct. 31, 2004, pp. 1-6, Nature Publishing Group.

* cited by examiner

*Primary Examiner*—Anh Phung
(74) *Attorney, Agent, or Firm*—McDermott Will & Emery LLP

(57) ABSTRACT

A data write current from a pinned layer to a free layer is larger than a data write current from the free layer to the pinned layer. A data read current is smaller in value than the data write current. In the case where a difference in data read current between a high-resistance state and a low-resistance state is relatively small, a sense amplifier is connected so that the data read current flows from the pinned layer to the free layer, namely from a source line to a bit line.

10 Claims, 19 Drawing Sheets

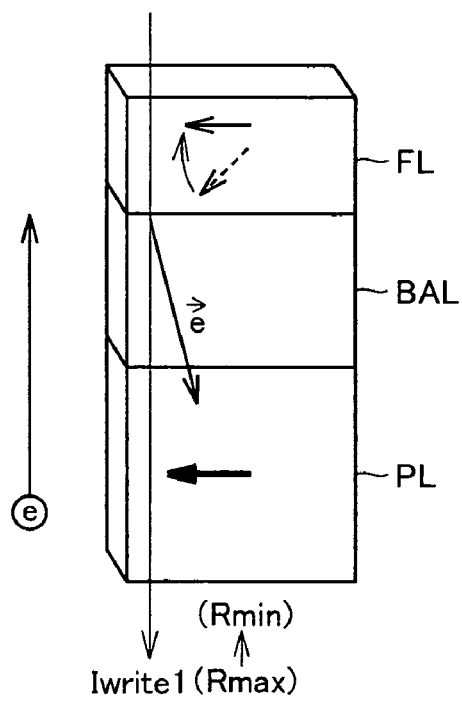
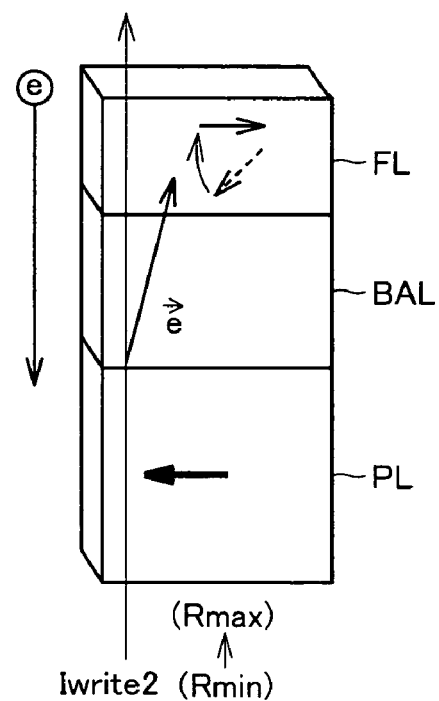

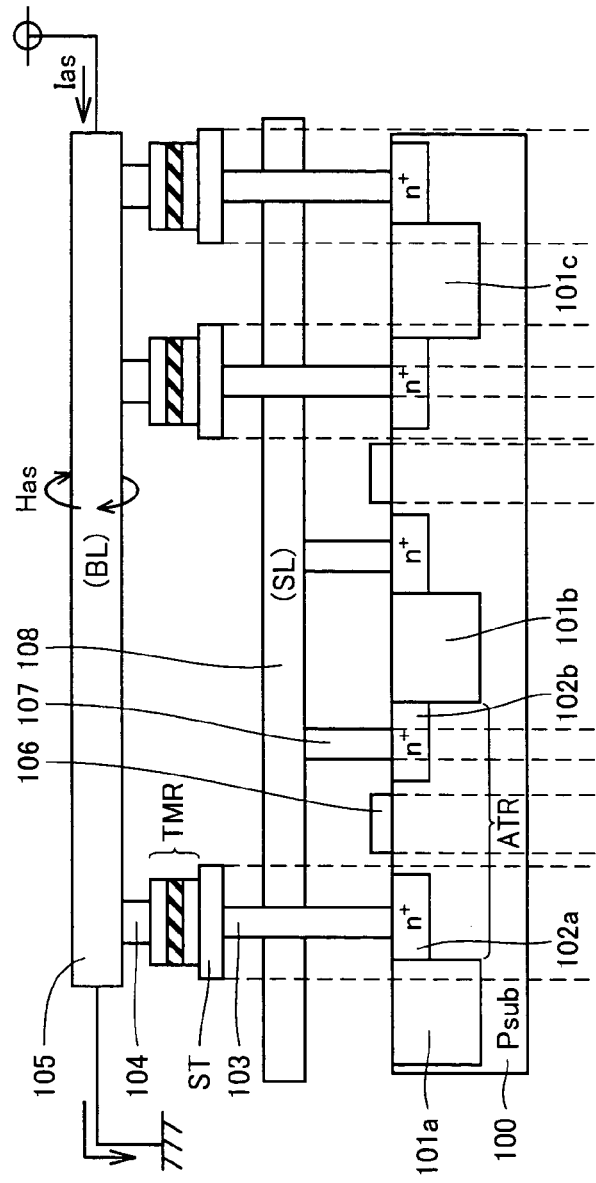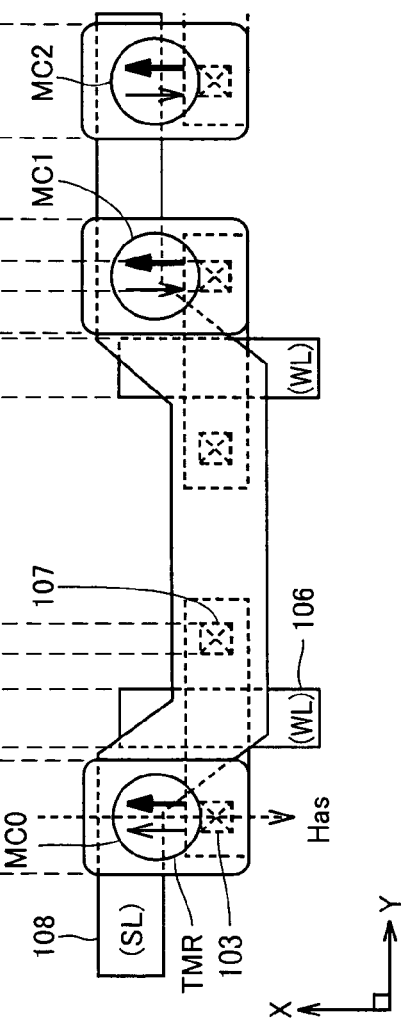
FIG.15A
FIG.15B

NONVOLATILE MEMORY DEVICE WITH WRITE ERROR SUPPRESSED IN READING DATA

BACKGROUND OF THE INVENTION

1. Field of the Invention

The present invention relates to a nonvolatile memory device. In particular, the invention relates to a random-access memory including memory cells having magnetic tunnel junctions (MTJ).

2. Description of the Background Art

In recent years, an MRAM (Magnetic Random-Access Memory) device has been of great interest as a new-generation nonvolatile memory device. The MRAM device is a nonvolatile memory device in which a plurality of thin-film magnetic elements formed in a semiconductor integrated circuit are used to store data in nonvolatile manner, and the thin film magnetic elements are each randomly accessible. In particular, recently it has been announced that an MRAM device is remarkably improved in performance by employment of the thin-film magnetic element using a magnetic tunnel junction (MTJ) as a memory cell.

Generally, in the case where data is read from a memory cell which is used as a storage element of the nonvolatile memory device, electric current flowing through a tunneling magneto-resistance element (TMR) forming the storage element or an end-to-end voltage of the TMR can be measured so as to indirectly measure the resistance value of the TMR and thereby read data.

On the other hand, development has been carried out for producing a cell configuration of the MRAM device through a simple process, like that for a cell configuration of a DRAM (Dynamic Random-Access Memory).

Specifically, while a memory cell of a common MRAM device adopts a cell configuration having word lines for writing in addition to word lines for reading, memory cells according to the spin-injection method have recently been proposed as memory cells for which it is unnecessary to provide word lines for writing, as disclosed for example in Japanese Patent Laying-Open Nos. 2005-011907, 2004-111904 and 2005-092912.

The memory cell of the spin-injection method differs from a currently-used MRAM device in terms of how data is written. For a memory cell of the currently-used MRAM device, a method is employed of allowing current to flow through lines (including write word line) adjacent to a TMR element to generate magnetic fields and thereby reverse magnetization. In contrast, for the memory cell of the spin-injection method, a method is employed according to which current is applied directly through a TMR element to reverse magnetization of the TMR element. The direction in which the current flows is changed to switch magnetization of a free layer to parallel or antiparallel magnetization with respect to a fixed layer. In this respect, this is called the spin injection method since magnetization is reversed by the function of spin-polarized electrons in the current. In this way, a simple cell configuration can be achieved without the necessity of particularly providing word lines for writing to memory cells of the MRAM device.

However, regarding an MRAM device of the spin injection method, data is written to a memory cell by reversing magnetization using a current applied directly to a TMR element as described above and therefore, depending on an amount of a current applied then for reading the data, the stored data could be inverted as it is read, namely a write error could occur.

SUMMARY OF THE INVENTION

The present invention has been made to solve the above-described problem. An object of the present invention is to provide a nonvolatile memory device having memory cells using the spin injection method for the MRAM device, capable of suppressing write errors in reading data.

A nonvolatile memory device according to the present invention includes: a plurality of memory cells arranged in rows and columns; and a plurality of first and second current lines provided correspondingly to memory cell columns respectively for supplying a current via a selected memory cell in data read operation or data write operation. The memory cells each include a magneto-resistance element provided between corresponding first and second current lines for executing magnetic nonvolatile data storage. The magneto-resistance element includes: a fixed magnetization layer electrically coupled with the corresponding first current line and magnetized in a first magnetization direction, a free magnetization layer electrically coupled with the corresponding second current line, and magnetized in one of the first magnetization direction and a second magnetization direction opposite to the first magnetization direction, based on spin-polarized electrons depending on a direction in which a data write current flows via the corresponding first and second current lines in the data write operation, and a barrier layer of a non-magnetic material provided between the fixed magnetization layer and the free magnetization layer. The nonvolatile memory device further includes a data read circuit supplying, in the data read operation, to the first and second current lines corresponding to the selected memory cell, a data read current in a direction in which disturb is unlikely to occur.

Another nonvolatile memory device according to the present invention includes: a plurality of memory cells arranged in rows and columns; and a plurality of first and second current lines provided correspondingly to memory cell columns respectively for supplying a current via a selected memory cell in data read operation or data write operation. The memory cells each include a magneto-resistance element provided between corresponding first and second current lines for executing magnetic nonvolatile data storage. The magneto-resistance element includes a fixed magnetization layer electrically coupled with the corresponding first current line and magnetized in a first magnetization direction, a free magnetization layer electrically coupled with the corresponding second current line, and magnetized in one of the first magnetization direction and a second magnetization direction opposite to the first magnetization direction, based on spin-polarized electrons depending on a direction in which a data write current flows via the corresponding first and second current lines in the data write operation, and a barrier layer of a non-magnetic material provided between the fixed magnetization layer and the free magnetization layer. The nonvolatile memory device further includes a data read circuit supplying, in the data read operation, to the first and second current lines corresponding to the selected memory cell, a data read current in the same direction as a direction that causes the free magnetization layer of the magneto-resistance element to be magnetized in the second magnetization direction in the data write operation.

The nonvolatile memory device in accordance with the present invention provides the data read circuit that supplies a data read current to corresponding first and second current lines in a direction in which disturb is unlikely to occur, for the memory cell including the magneto-resistance element having the free magnetization layer magnetized in one of the first magnetization direction and the second magnetization direction opposite to the first magnetization direction, based on spin-polarized electrons according to the direction in which the data write current flows. Thus, the nonvolatile memory device preventing write error in the data read operation can be achieved.

That another nonvolatile memory device in accordance with the present invention provides the data read circuit that supplies a data read current, in the data read operation, in the same direction as a direction that causes the free magnetization layer of the magneto-resistance element to be magnetized in the second magnetized direction in the data write operation, for the memory cell including the magneto-resistance element having the free magnetization layer magnetized in one of the first magnetization direction and the second magnetization direction opposite to the first magnetization direction based on spin-polarized electrons according to the direction in which the data write current flows. Thus, the data read current can be supplied to the first and second current lines in the direction in which disturb is unlikely to occur. Accordingly, the nonvolatile memory device preventing write error in the data read operation can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5A and 5B illustrate how the magnetization direction of a memory cell is reversed according to the first embodiment of the present invention.

FIGS. 15A and 15B illustrate that data write current flows from one end toward the other end of a bit line, according to the fourth modification of the first embodiment of the present invention.

DESCRIPTION OF THE PREFERRED EMBODIMENTS

Figure 1:
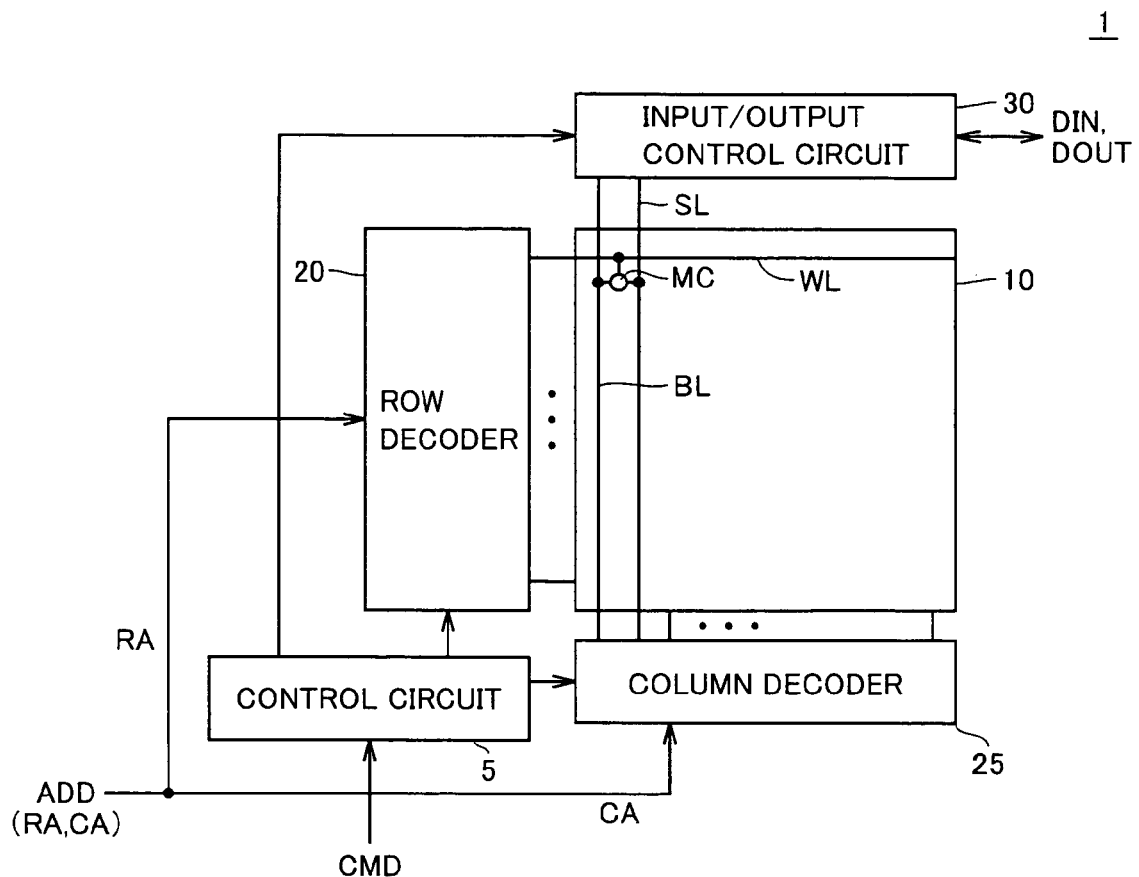
FIG. 1 is a schematic block diagram showing the entire configuration of an MRAM device illustrated as a typical example of a nonvolatile memory device according to a first embodiment of the present invention.

Embodiments of the present invention are now described in detail with reference to the drawings. In the drawings, like or corresponding components are denoted by like reference characters and a description thereof is not repeated.

First Embodiment

Referring to FIG. 1, an MRAM device 1 which is illustrated as a typical example of a nonvolatile memory device according to a first embodiment of the present invention includes a control circuit 5 controlling, in response to control signal CMD, the entire operation of MRAM device 1, as well as a memory array 10 including MTJ memory cells MC arranged in rows and columns. Here, rows and columns in which a plurality of memory cells MC are arranged in memory array 10 are also referred to as memory cell rows and memory cell columns, respectively.

Further, MRAM device 1 includes a row decoder 20, a column decoder 25 and an input/output control circuit 30. Row decoder 20 selectively performs selection of a row to be accessed in memory array 10, based on row address RA included in address signal ADD. Column decoder 25 selectively performs selection of a column to be accessed in memory array 10, based on column address CA included in address signal ADD.

Input/output control circuit 30 controls input and output of such data as input data DIN and output data DOUT and, in response to an instruction from control circuit 5, transmits data to an internal circuit or outputs data to an external element.

In the following description, a high-voltage state and a low-voltage state, which are represented in binary manner, of signals, signal lines and data for example are also referred to as "H" level and "L" level, respectively.

In the present example, memory array 10 is shown to include a single memory cell MC as a representative one, as well as a single word line WL provided correspondingly to a memory cell row, a single bit line BL and a single source line SL provided correspondingly to a memory cell column as representative ones respectively.

Figure 2:
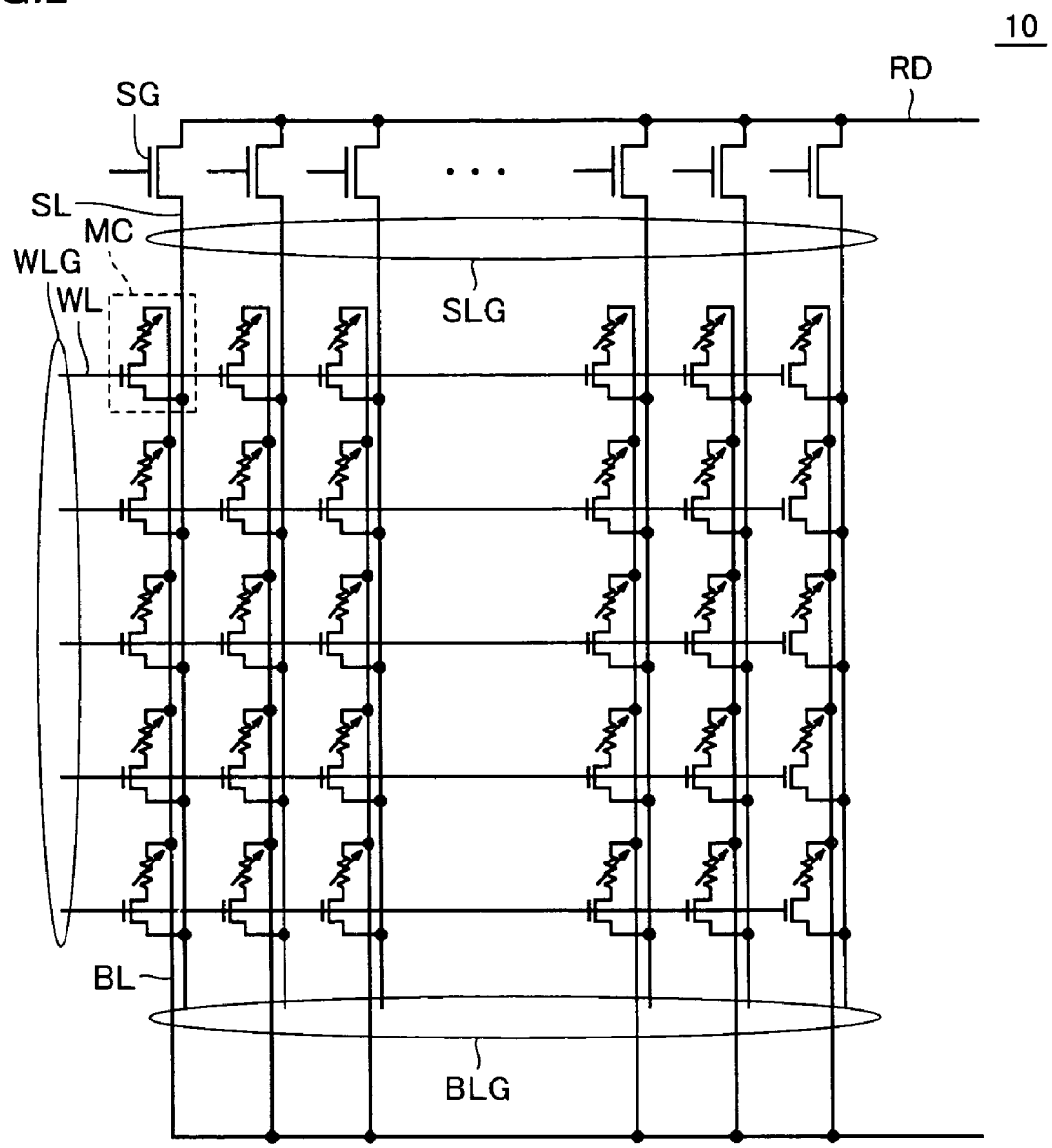
FIG. 2 is a schematic diagram showing a memory array according to the first embodiment of the present invention.

Referring to FIG. 2, memory array 10 in the first embodiment of the present invention includes memory cells MC arranged in rows and columns in integrated manner; a plurality of bit lines BL and source lines SL provided correspondingly to memory cell columns respectively; and a plurality of word lines WL provided correspondingly to memory cell rows respectively. Further, referring to FIG. 2, a bit line group BLG representing a plurality of bit lines BL and a source line group SLG representing a plurality of source lines SL are shown. Source lines SL and bit lines BL are provided in the same direction, namely in the column direction. Further, a word line group WLG representing a plurality of word lines WL is provided. In addition, a plurality of gate transistors SG are provided correspondingly to a plurality of sources lines SL respectively, for electrically coupling one of a plurality of source lines SL and a data line RD. Here, to the gate of gate transistor SG, a column select signal is input from column decoder 25.

Memory cell MC is configured to be connected between bit line BL and source line SL. The configuration of memory cell MC is described below.

Figure 3A:
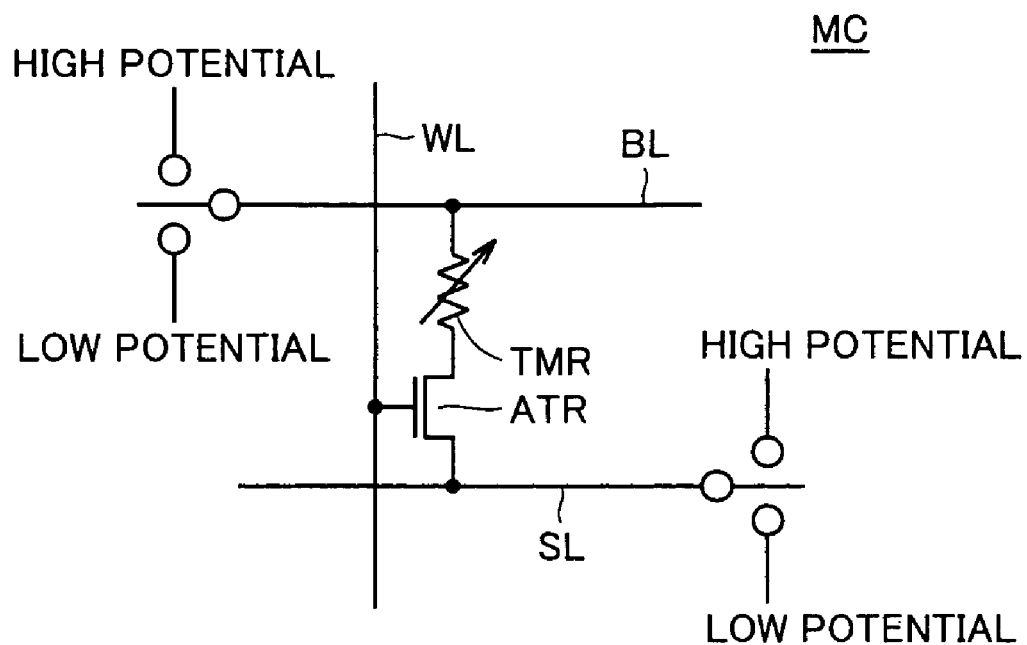
FIGS. 3A and 3B conceptually illustrate a memory cell according to the first embodiment of the present invention.

Referring to FIG. 3A, memory cell MC in the first embodiment of the present invention includes a tunneling magneto-resistance element TMR and an access transistor ATR. Tunneling magneto-resistance element TMR and access transistor ATR are connected in series between bit line BL and source line SL. Specifically, access transistor ATR is provided between source line SL and tunneling magneto-resistance element TMR and has its gate electrically coupled with word line WL. Tunneling magneto-resistance element TMR is electrically coupled between access transistor ATR and bit line BL.

In order to write data to memory cell MC, at least one of bit line BL and source line SL is set to a high potential or a low potential, which is described hereinlater. In other words, when data is to be written, an electric current path is formed via memory cell MC from bit line BL to source line SL or from source line SL to bit line BL so as to write data.

Figure 3B:
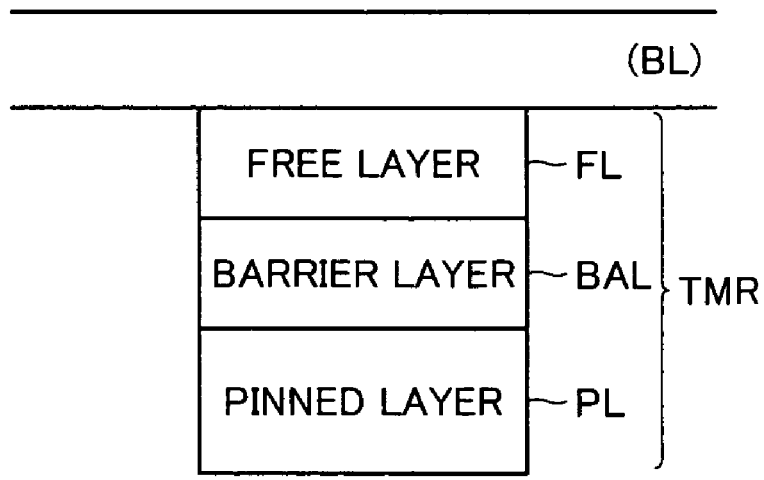

Referring to FIG. 3B, tunneling magneto-resistance element TMR includes a ferromagnetic layer (fixed layer) (hereinafter also referred to as pinned layer) PL having a certain fixed magnetization direction, a ferromagnetic layer (free layer) (hereinafter also referred to as free layer simply) FL having its magnetization direction reversed by an electric current applied into the element, and a tunneling barrier layer (tunneling film) BAL formed of an insulating film between pinned layer PL and free layer FL.

Free layer FL is magnetized in the same direction as that of pinned layer PL or in the direction opposite to that of pinned layer PL depending on the direction in which a data write current flows that is applied according to the level of storage data to be written. These pinned layer PL, barrier layer BAL and free layer FL form a magnetic tunnel junction.

Tunneling magneto-resistance element TMR has its electric resistance varied depending on the relative relation between respective magnetization directions of pinned layer PL and free layer FL. Specifically, in the case where the magnetization direction of free layer FL and that of pinned layer PL are the same (parallel with each other), tunneling magneto-resistance element TMR has its electric resistance in a low-resistance state (minimum value) Rmin. In the case where respective magnetization directions of free layer FL and pinned layer PL are opposite (antiparallel) to each other, the electric resistance of TMR is in a high-resistance state (maximum value) Rmax.

When data is to be written, word line WL is activated to turn on access transistor ATR. In this state, depending on whether the data write current is supplied from free layer FL to pinned layer PL or the data write current is supplied from pinned layer PL to free layer FL, the magnetization direction is reversed.

Figure 4A:
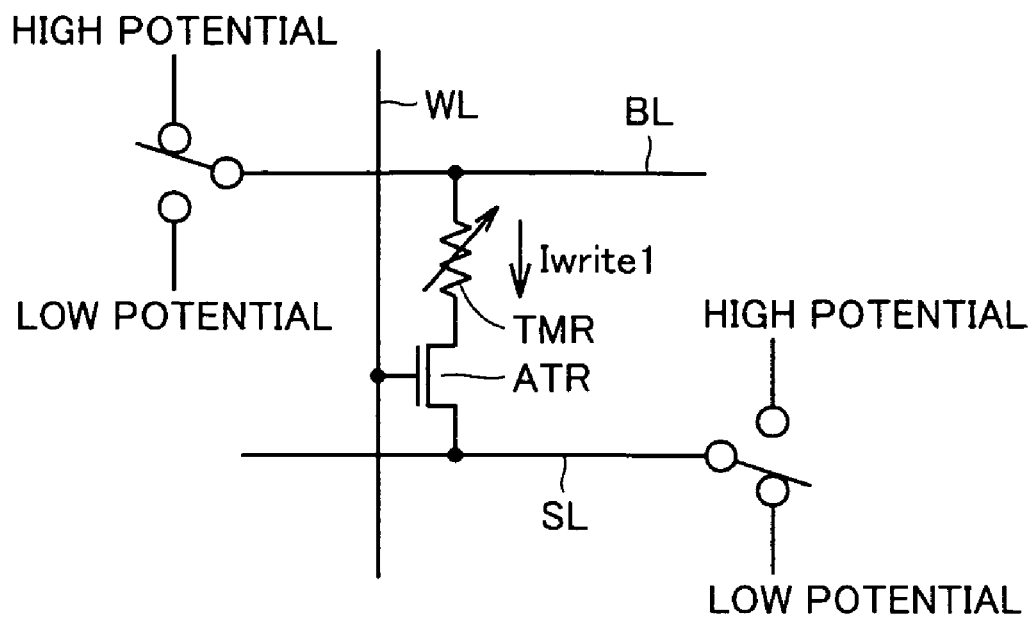
FIGS. 4A and 4B illustrate how data is written to a memory cell according to the first embodiment of the present invention.
Figure 4B:
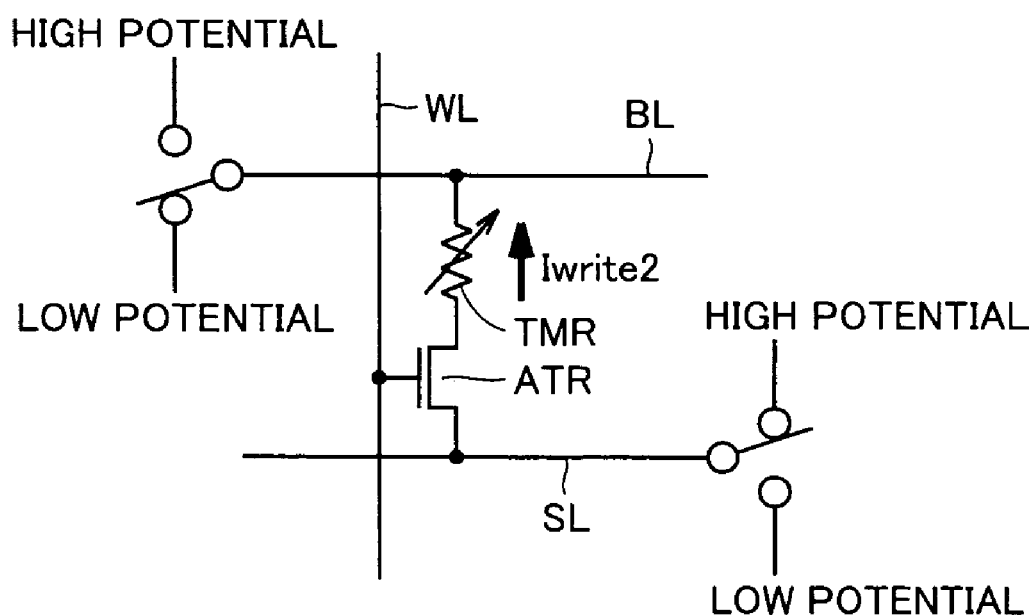

FIGS. 4A and 4B illustrate how data is written to memory cell MC in the first embodiment of the present invention.

Referring to FIG. 4A, bit line BL is set to a high potential while source line SL is set to a low potential to allow data write current Iwrite1 to flow to tunneling magneto-resistance element TMR. In other words, in this case, data write current Iwrite1 flows from bit line BL to source line SL. In contrast, referring to FIG. 4B, bit line BL is electrically connected to a low potential while source line SL is electrically connected to a high potential. In this case, data write current Iwrite2 flows from source line SL to bit line BL. In other words, the current flows from pinned layer PL to free layer FL.

FIGS. 5A and 5B illustrate how the magnetization direction of memory cell MC is reversed in the first embodiment of the present invention.

Referring to FIG. 5A, it illustrates the case where data write current Iwrite1 flows from bit line BL to source line SL.

Here, pinned layer PL as shown is magnetized in the direction from right to left. Then, injected spin-polarized electrons flow in the opposite direction to the direction of data write current Iwrite1, and spin electrons in the same direction as the magnetization direction of pinned layer PL flow into free layer FL. Accordingly, the magnetization direction of free layer FL is the same as that of pinned layer PL, namely they are in parallel.

Referring to FIG. 5B, it illustrates the case where data write current Iwrite2 flows from source line SL to bit line BL.

Here, pinned layer PL as shown is magnetized in the direction from right to left. Then, injected spin-polarized electrons flow in the opposite direction to data write current Iwrite2. Namely, the spin-polarized electrons flow from free layer FL to pinned layer PL. Then, among spin-polarized electrons flowing from free layer FL, spin-polarized electrons in the same direction as that of pinned layer PL flow through while spin-polarized electrons in the opposite direction are reflected to act on free layer FL and thereby cause the direction to become opposite to that of pinned layer PL. Accordingly, respective magnetization directions of free layer FL and pinned layer PL are opposite (antiparallel) to each other.

Regarding respective magnitudes of data write current Iwrite1 and data write current Iwrite2, data write current Iwrite1 is used to determine the magnetization direction by spin electrons in the same direction as that of spin electrons flowing through pinned layer PL act on free layer FL. As for data write current Iwrite2, reflected spin electrons act on free layer FL to determine the magnetization direction. Thus, data write current Iwrite2 is set to be larger than data write current Iwrite1.

Figure 6A:
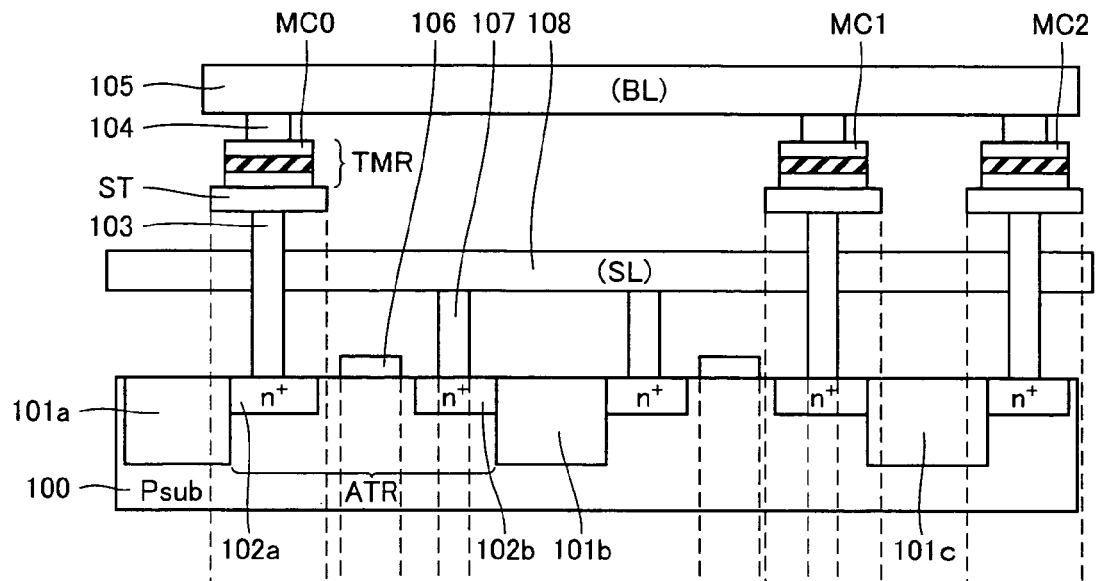
FIGS. 6A and 6B illustrate a configuration where memory cells, source lines and bit lines for example are interconnected.
Figure 6B:
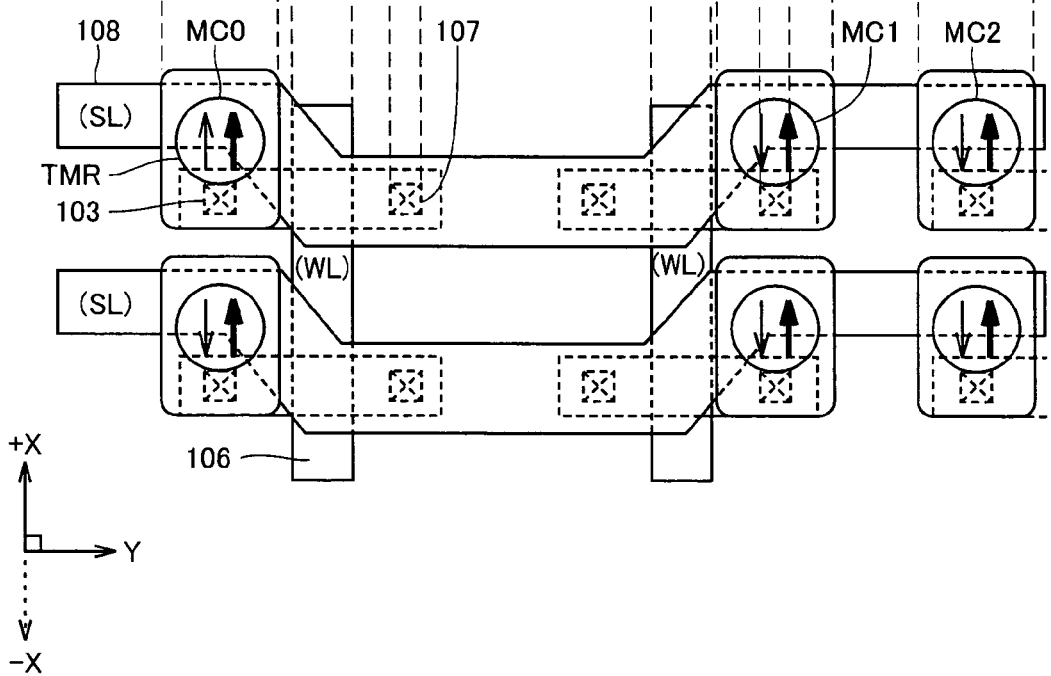

In connection with FIGS. 6A and 6B, a description is given of an interconnect configuration in which memory cells MC, source lines and bit lines for example are interconnected in the first embodiment of the present invention.

Referring to FIG. 6A, the interconnect configuration of memory cells MC, source lines and bit lines for example is shown. Specifically, access transistor ATR formed on a p-type semiconductor substrate Psub includes source/drain regions 102a and 102b that are n-type regions and a gate region 106. The gate region of access transistor ATR is formed as a polysilicon gate 106 in the same interconnect layer as word line WL for the purpose of increasing the degree of integration. Source/drain region 102b is electrically coupled via a contact hole 107 with source line SL formed in a first metal interconnect layer 108. Source/drain region 102a is electrically coupled via a contact hole 103 with a strap ST. Tunneling magneto-resistance element TMR is electrically coupled between strap ST and bit line BL formed in a second metal interconnect layer 105 via a contact hole 104. Other memory cells MC are interconnected in a similar manner, and the detailed description thereof is not repeated.

Between memory cells MC adjacent to each other, insulating regions 101a, 101b, 101c formed on p-type semiconductor substrate Psub are provided respectively.

FIG. 6B illustrates a layout (plan view) as seen from the above of the interconnect configuration of memory cells MC in the first embodiment of the present invention. Two memory cell columns are shown.

Referring to FIG. 6B, the magnetization direction of tunneling magneto-resistance element TMR provided on the upper side of strap ST is shown. Specifically, in tunneling magneto-resistance element TMR the pinned layer and the free layer are magnetized in the X direction. The pinned layer is magnetized in the +X direction while the free layer is magnetized in the +X or −X direction. As to memory cell MC0, the pinned layer and the free layer are both magnetized in the +X direction.

Word line WL is provided in the X direction and source line SL and bit line BL are provided in the Y direction.

As to memory cell MC0, strap ST connected to tunneling magneto-resistance element TMR is electrically coupled via contact hole 103 with source/drain region 102a which is an n-type region. N-type source/drain region 102b is electrically coupled via contact hole 107 with source line SL in the first metal interconnect layer 108. The first metal interconnect layer 108 which is source line SL is disposed via contact hole 103 in the Y direction.

As to the adjacent memory cell MC1 as well, electrical coupling with source line SL and bit line BL is made in a similar manner of connection to the above-described one. Regarding the magnetization direction of the pinned layer and the free layer in tunneling magneto-resistance element TMR of memory cell MC1, the magnetization direction of the pinned layer is the +X direction while that of the free layer is the −X direction. The aforementioned magnetization direction of memory cell MC1 is applied as well to memory cell MC2. Although one memory cell column is described here, the components are disposed similarly in other memory cell columns.

Figure 7:
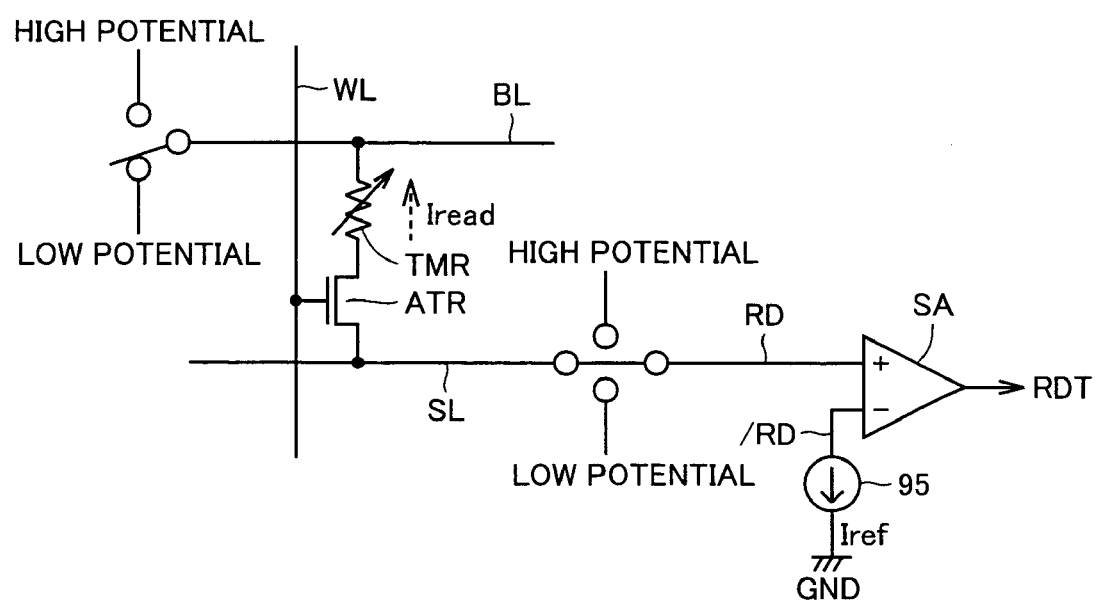
FIG. 7 illustrates how data is read according to the first embodiment of the present invention.

In connection with FIG. 7, how data is read in the first embodiment of the present invention is described.

According to the first embodiment of the present invention, a description is given of the case where a data read current is applied from the pinned layer to the free layer for the purpose of suppressing read disturb.

As described above, data write current Iwrite2 from pinned layer PL to free layer FL illustrated in FIGS. 5A and 5B is larger than data write current Iwrite1 from free layer FL to pinned layer PL. The data read current has its value smaller than that of the data write current. As to the direction of the data read current, the data read current may be applied from pinned layer PL to free layer FL which is the same direction as that of data write current Iwrite2 larger in electric current amount than data write current Iwrite1, since influences of the read disturb that causes inversion of the data will be smaller in the case where the data read current is applied in this direction.

Therefore, in the first embodiment of the present invention, a sense amplifier SA included in a data read circuit is connected so that the data read current flows from pinned layer PL to free layer FL, namely from source line SL to bit line BL.

Specifically, data line RD which is electrically coupled via gate transistor SG with source line SL and one end of sense amplifier SA are electrically coupled. The other end of sense amplifier SA is electrically coupled with data line /RD. Data line /RD is electrically coupled with a constant current source 95 and receives reference current Iref in data reading.

It is supposed that a precharge current is applied from the sense amplifier to bit line BL for example, which may depend on the configuration of the sense amplifier. Sense amplifier SA is electrically coupled with a higher potential (for example supply voltage VDD), and bit line BL is electrically coupled with a lower potential (for example ground voltage GND). Accordingly, in data reading, data read current Iread according to the resistance value of memory cell MC is supplied from sense amplifier SA via data line RD, source line SL, memory cell MC and bit line BL.

Sense amplifier SA compares data read current Iread flowing through data line RD with reference current Iref flowing through data line /RD to output read data RDT based on the comparison.

Figure 8:
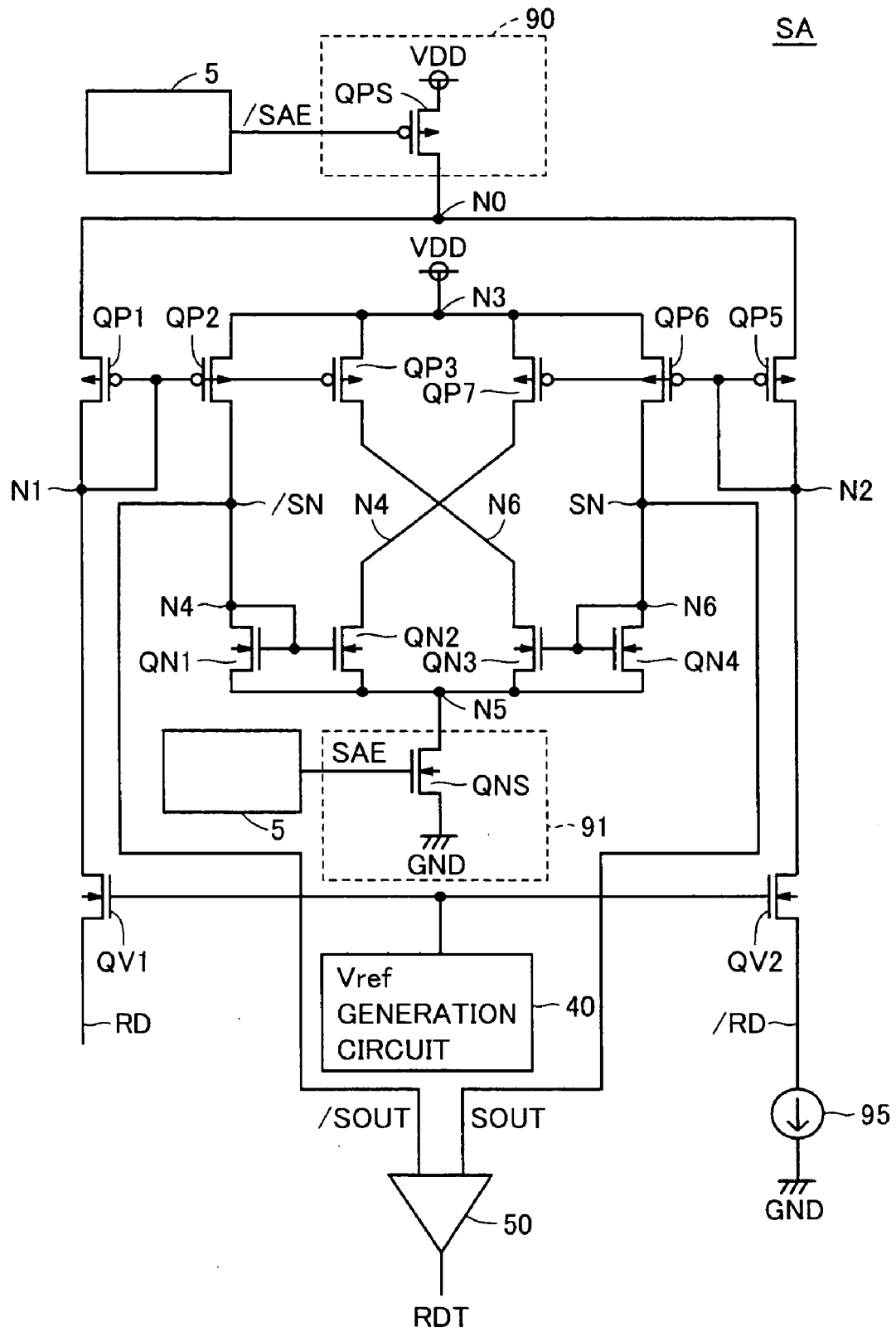
FIG. 8 is a circuit configuration diagram of a sense amplifier according to the first embodiment of the present invention.

Referring to FIG. 8, sense amplifier SA in the first embodiment of the present invention includes: a voltage supply unit 90 for supplying power supply voltage VDD to a power supply node N0; a transistor QP1 disposed between node N0 and a node N1 and having its gate electrically coupled with node N1; a transistor QP2 disposed between a node N3 receiving power supply voltage VDD applied thereto and a sense node /SN and having its gate electrically coupled with node N1; a transistor QP3 disposed between node N3 and a node N6 and having its gate electrically coupled with node N1; a transistor QP5 disposed between node N0 and a node N2 and having its gate electrically coupled with node N2, a transistor QP6 disposed between node N3 and a sense node SN and having its gate electrically coupled with node N2; a transistor QP7 disposed between node N3 and a node N4 and having its gate electrically coupled with node N2; a transistor QN1 disposed between sense node /SN and a node N5 and having its gate electrically coupled with sense node /SN; a transistor QN2 disposed between node N4 and node N5 and having its gate electrically coupled with sense node /SN; a transistor QN3 disposed between node N6 and node N5 and having its gate electrically coupled with sense node SN; a transistor QN4 disposed between sense node SN and node N5 and having its gate electrically coupled with sense node SN; and a voltage supply unit 91 for supplying ground voltage GND to node N5.

Further, an amplifier 50 is included that is connected to sense nodes SN, /SN for further amplifying a difference between sense data SOUT and /SOUT transmitted to sense nodes SN and /SN to output read data RDT.

Further, a transistor QV1 disposed between node N1 and data line RD and having its gate receiving reference voltage Vref generated by a Vref generation circuit 40, and a transistor QV2 disposed between node N2 and data line /RD and having its gate receiving reference voltage Vref are included. Accordingly, transistors QV1 and QV2 keep data lines RD, /RD at the reference voltage or less.

Voltage supply unit 90 includes a transistor QPS disposed between power supply voltage VDD and node N0 and having its gate receiving from control circuit 5 control signal /SAE which is activated to "L" level when data is read. Further, voltage supply unit 91 includes a transistor QNS disposed between ground voltage GND and node N5 and having its gate receiving from control circuit 5 control signal SAE which is activated to "H" level when data is read. In response to input of control signals SAE and /SAE, sense amplifier SA is activated. It is supposed here as an example that control signals SAE and /SAE are output from control circuit 5 when data is read.

It is supposed here for example that transistors QP1 to QP7 and QPS are P-channel MOS transistors, and that transistors QN1 to QN4, QNS, QV1 and QV2 are N-channel MOS transistors. In the present example, transistors QP1 to QP7 are identical in transistor size. Further, transistors QN1 to QN4 are identical in transistor size.

Furthermore, transistors QP1 to QP3 constitute a current mirror circuit, operating to supply the same operating current (mirror current). Transistors QP5 to QP7 constitute a current mirror circuit, operating to supply the same operating current. Transistors QN1 and QN2 constitute a current mirror circuit, operating to supply the same operating current (mirror current). Transistors QN3 and QN4 constitute a current mirror circuit, operating to supply the same operating current. In the description of this example, although transistors are identical in transistor size, the transistor size can be adjusted to adjust the amount of the operating current. Specifically, an operating current is supplied according to the ratio in size between transistors constituting a current mirror circuit. This is applied as well in the following description.

Transistor QP2 supplies, to sense node /SN, the same operating current as the operating current flowing through node N1. Transistors QP7, QN1, QN2 supply the same operating current as the operating current flowing from sense node /SN to node N2.

Transistor QP6 supplies, to sense node SN, the same operating current as the operating current flowing through node N2, and transistors QP3, QN3, QN4 supply the same operating current as the operating current flowing from sense node SN to node N1.

Sense amplifier SA in the first embodiment of the present invention keeps data lines RD, /RD at a reference voltage or lower and generates, on sense nodes SN, /SN, a voltage difference depending on a difference in passing current generated on data lines RD, /RD.

A description is now given of sense operation of sense amplifier SA.

An example is described in which passing currents Ia and Ib flow respectively through read data buses RDB, /RDB. Then, since transistors QP1 to QP3 constitute the current mirror circuit as described above, transistors QP2 and QP3 operate to supply to sense node /SN and node N6 the same operating current as passing current Ia passing through transistor QP1. At a similar timing, transistors QP6 and QP7 operate to supply to sense node SN and node N4 the same operating current as passing current Ib flowing through transistor QP5. As described above, transistors QN1 and QN2 also constitute the current mirror circuit, and transistor QN1 operates to supply the same operating current Ib as that of transistor QN2 from sense node /SN to node N5 connected to the ground voltage. Further, as described above, transistors QN3 and QN4 also constitute the current mirror circuit, and transistor QN4 operates to supply the same operating current Ia as that of transistor QN3 from sense node SN to node N5 connected to ground voltage GND.

Accordingly, to sense node SN, operating current Ib is to be supplied by transistor QP6, while transistor QN4 is to supply the same operating current Ia as that of transistor QN3 from sense node SN. To sense node /SN, operating current Ia is to be supplied by transistor QP2, while transistor QN1 is to supply the same operating current Ib as that of transistor QN3 from sense node /SN.

Thus, with the current mirror circuits, mirror currents are generated according to the passing currents flowing through data lines RD, /RD, and an electric current difference between the generated mirror currents is converted into a voltage difference to be output to sense nodes SN, /SN. In the case where there is the relation between the operating currents, Ia>Ib, for example, respective voltage levels of sense nodes SN and /SN are converted into "L" level and "H" level respectively. In the case where there is the relation between the operating currents, Ib>Ia, respective voltage levels of sense nodes SN and /SN are converted into "H" level and "L" level respectively.

By amplifier 50, sense outputs SOUT, /SOUT that are voltage levels of sense nodes SN, /SN are further amplified and read data RDT is generated.

Since the operating current causing sense amplifier SA to operate in the first embodiment corresponds to a memory cell current according to storage data of a memory cell, the operating current for the amplifying operation of sense amplifier SA is significantly small. Thus, sense amplifier SA with reduced power consumption in data reading can be achieved.

Figure 9:
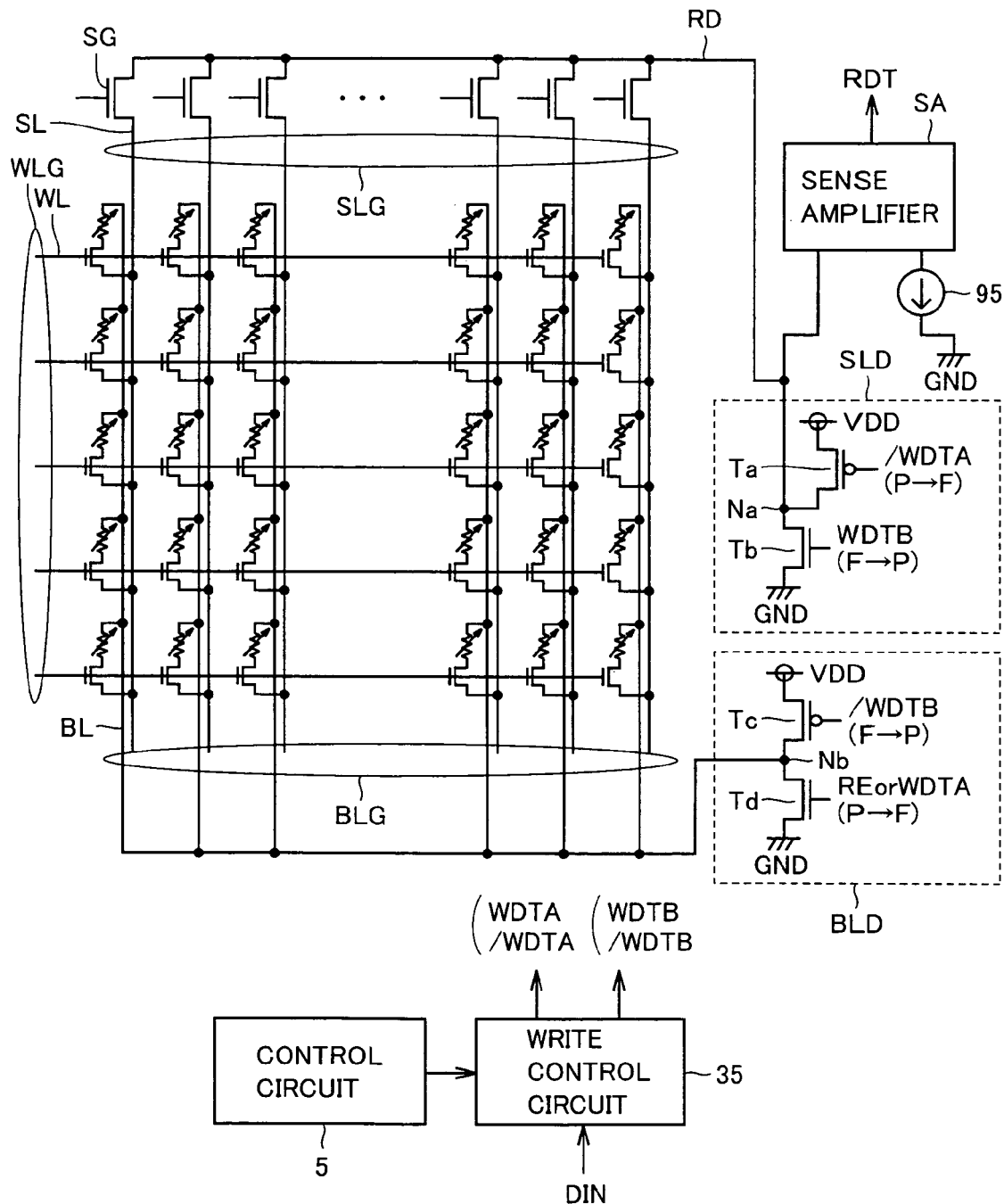
FIG. 9 illustrates a write driver in writing data according to the first embodiment of the present invention.

Referring to FIG. 9, as write drivers in data write operation in the first embodiment of the present invention, a source driver SLD disposed correspondingly to data line RD and a bit line driver BLD disposed correspondingly to bit line BL are provided. Further, a write control circuit 35 is provided receiving an instruction from control circuit 5 to generate write control signals WDTA, /WDTA and WDTB, /WDTB in the data write operation according to input data DIN.

Source driver SLD includes transistors Ta, Tb. It is supposed as an example that transistors Ta and Tb are a P-channel MOS transistor and an N-channel MOS transistor, respectively.

Transistor Ta is provided between power supply voltage VDD and a node Na and has its gate receiving write control signal /WDTA. Transistor Tb is provided between node Na and ground voltage GND and has its gate receiving write control signal WDTB. Node Na is electrically coupled with data line RD.

Bit line driver BLD includes transistors Tc, Td. Transistor Tc is connected between power supply voltage VDD and a node Nb and has its gate receiving write control signal /WDTB. Transistor Td is provided between node Nb and ground voltage GND and has its gate receiving write control signal WDTA or read control signal RE.

A description is given of the case where data write current Iwrite1 is supplied from free layer FL to pinned layer PL, namely from bit line BL to the source line.

In this case, write control circuit 35 sets write control signals WDTB and /WDTB to "H" level and "L" level, respectively, according to input data DIN (for example "0" data).

Accordingly, transistors Tb and Tc are activated. When transistor Tc of bit line driver BLD is turned on, power supply voltage VDD and node Nb are electrically coupled. In contrast, when transistor Tb of source line driver SLD is activated, ground voltage GND and node Na are electrically coupled. Thus, the potential of bit line BL becomes higher than the potential of source line SL so that data write current Iwrite1 is supplied from the bit line to source line SL.

Write control circuit 35 sets write control signals WDTA and /WDTA to "H" level and "L" level, respectively, according to input data DIN (for example "1" data).

Accordingly, transistor Td of bit line driver BLD and transistor Ta of source line driver SLD are activated. When transistor Td of bit line driver BLD is activated, node Nb and ground voltage GND are electrically coupled. In contrast, when transistor Ta of source line driver SLD is activated, power supply voltage VDD and node Na are electrically coupled. Thus, the potential of source line SL becomes higher than the potential of bit line BL so that data write current Iwrite2 is supplied from source line SL to bit line BL as described above. In the present example, the description is given of the case where input data DIN (for example "0" data) is input and accordingly data write current Iwrite1 is supplied while input data DIN (for example "1" data) is input and accordingly data write current Iwrite2 is supplied. However, the relation between the input data and the data write current is not limited to the above-described one, since an addition of an inverter reverses the data level of the input data. It is thus clearly seen that the opposite direction can be applied as well.

As described above, data write current Iwrite1 and data write current Iwrite2 are different in current amount (Iwrite2>Iwrite1) and therefore the size of transistors Ta to Td (driver transistors) is appropriately adjusted for the purpose of supplying a desired write current. However, change of the current amount is not limited to the above-described one and may be implemented by providing means for adjusting potentials of nodes N1, N2 in the sense amplifier. In this case, since bit line driver BLD and source line driver SLD can be designed so that the driver transistors have the same size, the area occupied by the driver transistors can be reduced.

A description is given of data reading.

When data is read, control circuit 5 inputs read control signal RE ("H" level) to transistor Td of bit line driver BLD.

Accordingly, transistor Td of bit line driver BLD is activated and node Nb and ground voltage GND are electrically coupled.

As described above, since control signals SAE and /SAE of sense amplifier SA are set to "H" level and "L" level respectively, a current path from source line SL to bit line BL is formed.

Thus, as described above, data read current Iread is supplied from sense amplifier SA via data line RD, source line SL, tunneling magneto-resistance element TMR, access transistor ATR and bit line BL.

As heretofore discussed, in accordance with the first embodiment of the present invention, a current path is formed so that the data read current flows from pinned layer PL to free layer FL, namely from source line SL to bit line BL. The data read current has its value smaller than that of the data write current. As for the direction of the data read current, the data read current may be supplied in the same direction as data write current Iwrite2 larger in current amount than data write current Iwrite1, namely in the direction from pinned layer PL to free layer FL, so as to suppress, to a greater extent, influences of read disturb causing inversion of data. In other words, write error due to the data read current can be prevented to implement an MRAM device using the spin injection method which is highly reliable. In addition, employment of the MRAM device using the spin injection method allows the MRAM device to be provided that has a cell configuration simpler and higher in layout efficiency.

First Modification of First Embodiment

Figure 10:
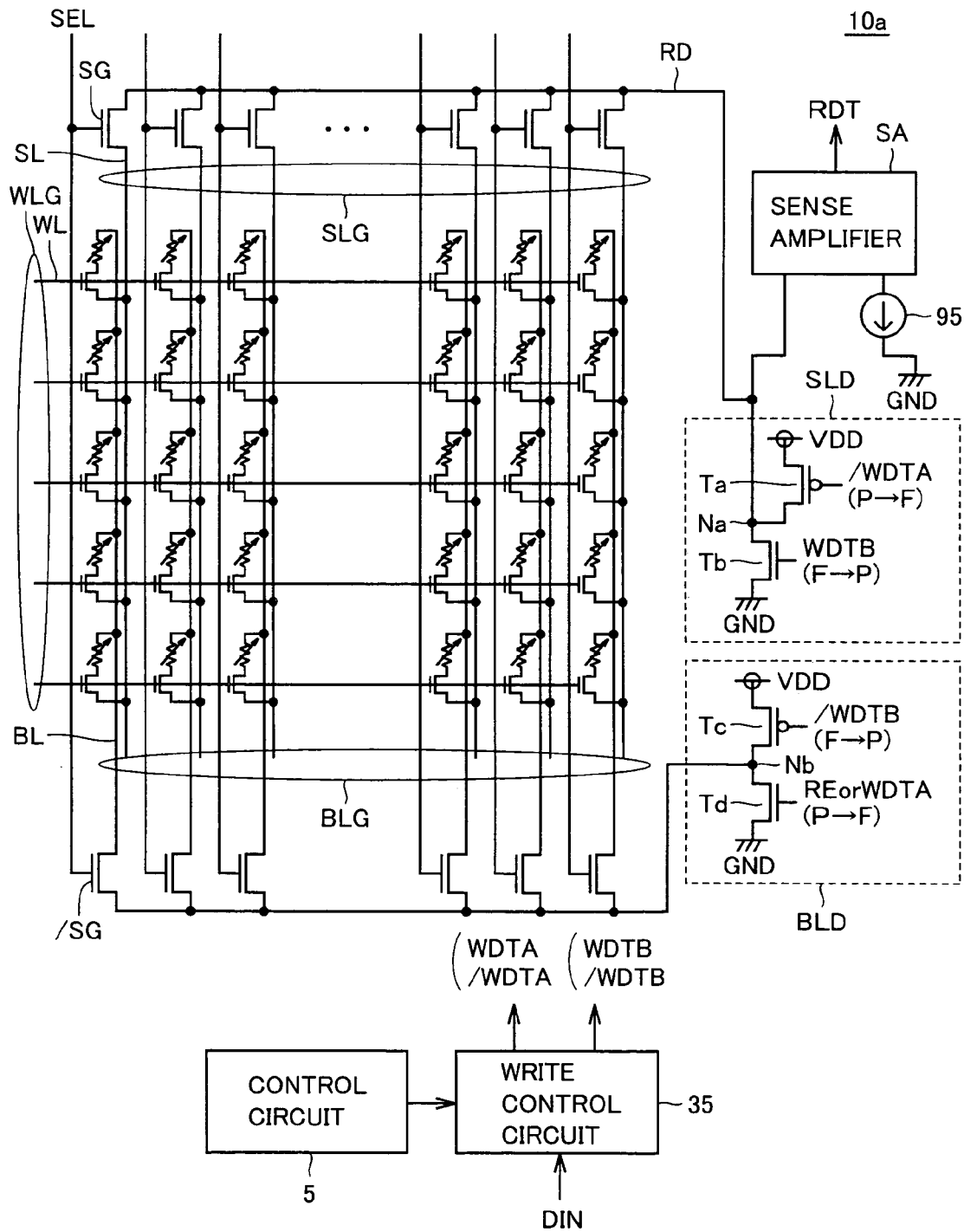
FIG. 10 illustrates a configuration of a memory array according to a first modification of the first embodiment of the present invention.

Referring to FIG. 10, a memory array 10a in a first modification of the first embodiment of the present invention differs from memory array 10 described in connection with FIG. 2 in that the configuration in FIG. 2 has gate transistor SG only between source line driver SLD and each source line SL, while the configuration in the first modification of the first embodiment further has gate transistors /SG between bit line driver BLD and a plurality of bit lines BL, respectively.

Specifically, gate transistor SG and gate transistor /SG are provided correspondingly to a memory cell column and are activated upon receiving input of column select signal SEL for a column select line from column decoder 25. In the present example, gate transistor /SG is also provided for bit line BL, bit line BL and source line SL of a selected column is electrically separated from bit lines BL and source lines SL of other non-selected columns.

Thus, while the configuration of the memory array described in connection with FIG. 2 for example has bit line BL that is always coupled electrically with other bit lines BL resulting in a heavy load, the configuration in FIG. 10 provides electrical separation from bit line BL and source line SL of a non-selected column and thereby reduces the load. Thus, precharge or discharge is increased in speed and consequently the time for access to a selected memory cell in data read operation and data write operation can be shortened.

Second Modification of First Embodiment

For a second modification of the first embodiment of the present invention, a description is given of a memory cell MC# which differs from memory cell MC in the first embodiment described above.

Figure 11:
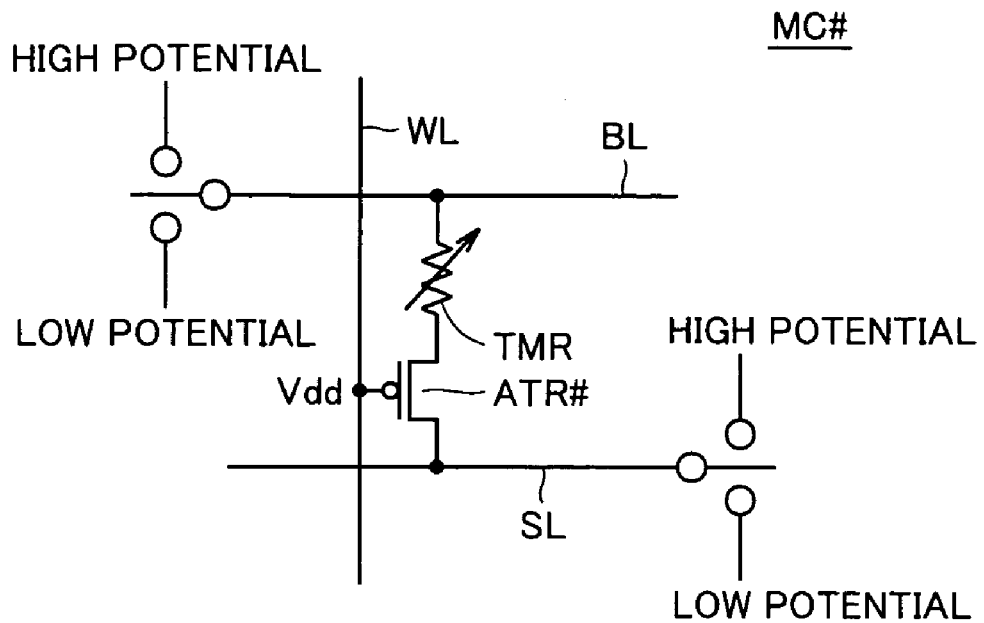
FIG. 11 illustrates a memory cell according to a second modification of the first embodiment of the present invention.

Referring to FIG. 11, a memory cell MC# in the second modification of the first embodiment includes a tunneling magneto-resistance element TMR and an access transistor ATR#.

Access transistor ATR# differs from access transistor ATR in that the access transistor of the N-channel MOS transistor is replaced with a P-channel MOS transistor.

Access transistor ATR# is activated when the potential of word line WL is set to a low potential to electrically couple, via tunneling magneto-resistance element TMR, bit line BL and source line SL. In the case where word line WL has a high potential, access transistor ATR# is in a non-activated state and thus a current path is not formed between bit line BL and source line SL.

In the case where a current path from source line SL to bit line BL is to be formed, a phenomenon occurs in which the resistance of tunneling magneto-resistance element TMR causes the potential of bit line BL coupled with tunneling magneto-resistance element TMR to float up. Then, a potential difference between source line SL and bit line BL is difficult to generate and thus a data write current could not sufficiently flow.

Thus, as the configuration of the second modification of the first embodiment, access transistor ATR can be changed to a P-channel MOS transistor to ensure the gate to source voltage. Thus, floating-up of the potential of the bit line can be suppressed and accordingly a sufficient data write current can be supplied.

Figure 12:
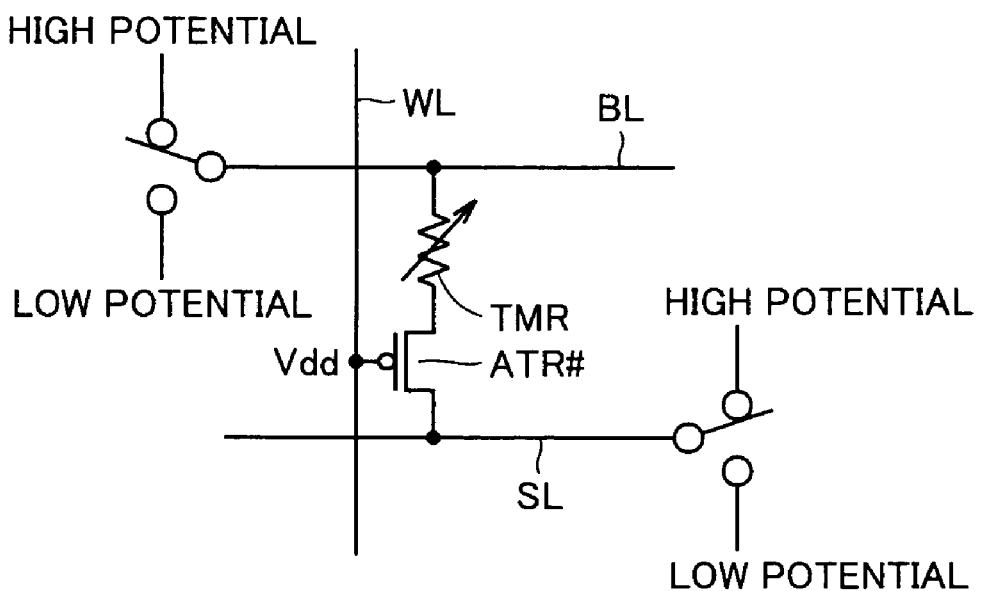
FIG. 12 illustrates the memory cell on standby according to the second modification of the first embodiment of the present invention.

In connection with FIG. 12, a standby state of memory cell MC# in the second modification of the first embodiment is described.

Referring to FIG. 12, in the standby state, bit line BL, source line SL and word line WL are each set to a high potential. Thus, all of the lines are set to the same potential to suppress occurrence of leak current in the standby state.

Third Modification of First Embodiment

Figure 13A:
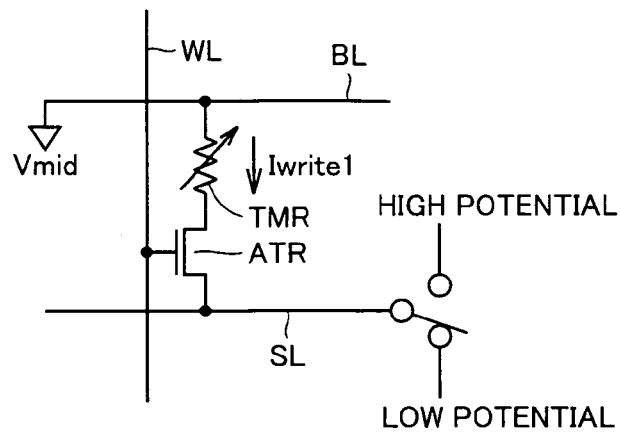
FIGS. 13A to 13C illustrate how data is written and read according to a third modification of the first embodiment of the present invention.
Figure 13B:
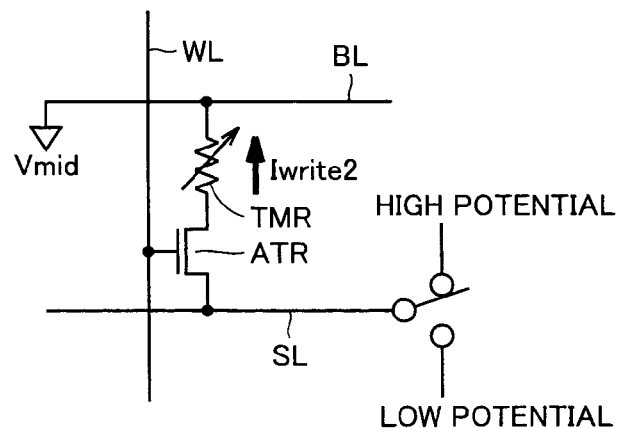
Figure 13C:
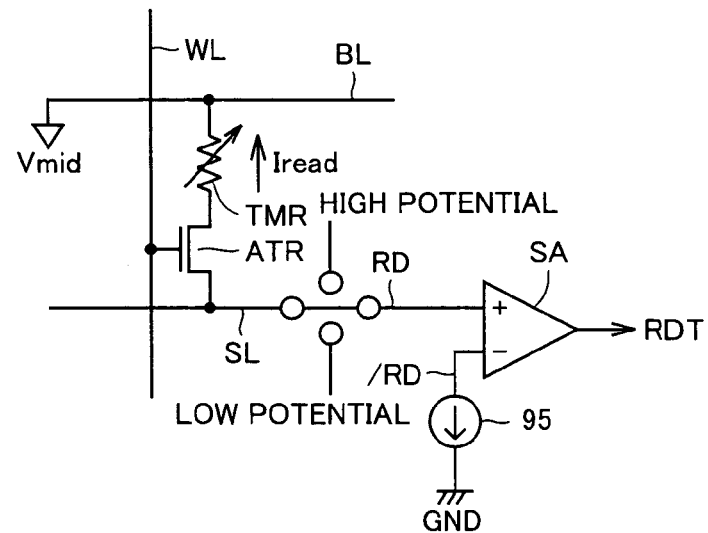

In connection with FIGS. 13A to 13C, data writing and data reading in a third modification of the first embodiment of the present invention are described.

Referring to FIG. 13A, in the present example, bit line BL is fixedly and electrically connected to a power supply voltage Vmid which is an intermediate potential between a high potential and a low potential. Then, source line SL is electrically coupled with the low potential to supply data write current Iwrite1 to tunneling magneto-resistance element TMR.

Referring to FIG. 13B, in the present example, bit line BL is fixedly and electrically connected to power supply voltage Vmid which is an intermediate potential between a high potential and a low potential. Then, source line SL is electrically coupled with the high potential to supply data write current Iwrite2. The high potential, intermediate potential and low potential in this example are appropriately set so that desired data write currents Iwrite1 and Iwrite2 are supplied to tunneling magneto-resistance element TMR.

Referring to FIG. 13C, how data is read is described.

In the present example, sense amplifier SA is electrically coupled with data line RD and bit line BL is fixedly and electrically connected to power supply voltage Vmid which is an intermediate potential as mentioned above. In this configuration, sense amplifier SA and data line RD are electrically coupled to set the potential of source line SL to be higher than the intermediate potential and thus data read current Iread can be supplied from source line SL to bit line BL.

Here, in order to supply desired data read current Iread, the potential of source line SL is appropriately set.

By employing the method as described above, bit line BL can always be connected fixedly to power supply voltage Vmid which is an intermediate potential, so that it is unnecessary to provide bit line driver BLD for bit line BL. Thus, the number of components of the circuit can be reduced and the layout area can be reduced.

Fourth Modification of First Embodiment

Figure 14:
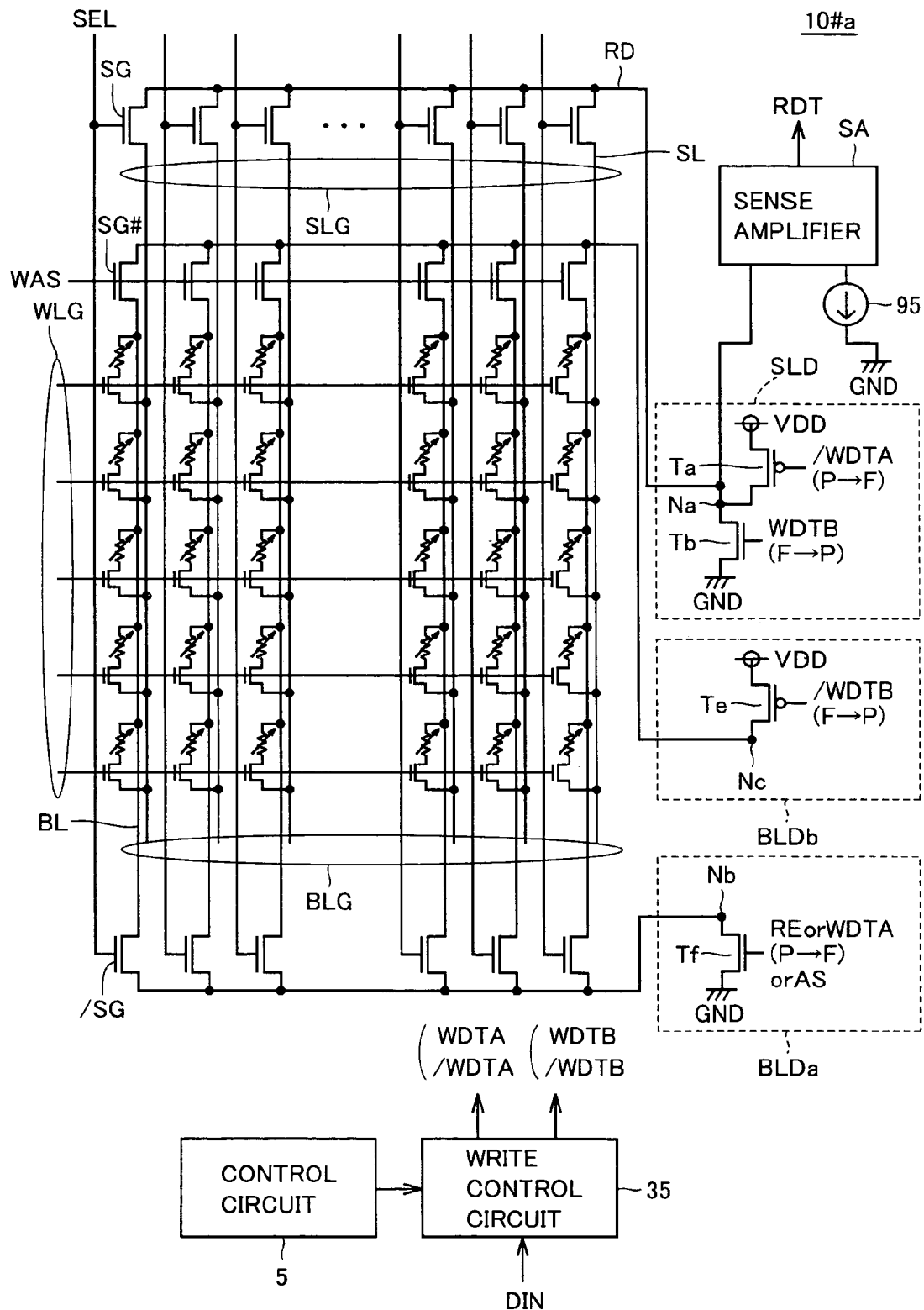
FIG. 14 is a configuration diagram of a memory array according to a fourth modification of the first embodiment of the present invention.

Referring to FIG. 14, a memory array 10#a in a fourth modification of the first embodiment of the present invention differs from memory array 10# in the first modification of the first embodiment in that a gate transistor SG# is further provided on the other end of bit line BL. A plurality of gate transistors SG# are provided on corresponding other ends respectively of a plurality of bit lines BL.

Further differences are that, on one end of bit lines BL, a bit line driver unit BLDa is provided via gate transistors /SG and, on the other end of bit lines BL, a bit line driver unit BLDb is provided via gate transistors SG#. Moreover, to the gates of a plurality of gate transistors SG# each, control signal WAS is supplied.

Features except for the above-described ones are similar to those of memory array 10a in FIG. 10, and the detailed description thereof is not repeated.

Bit line driver unit BLDa includes a transistor Tf provided between ground voltage GND and a node Nb and having its gate receiving write control signal WDTA or read control signal RDT or control signal AS.

Bit line driver unit BLDb includes a transistor Te provided between power supply voltage VDD and a node Nc and having its gate receiving write control signal /WDTB.

Source line driver SLD is the one as described above.

A description is given of the case where a data write current is supplied from free layer FL to pinned layer PL, namely from bit line BL to the source line.

In this case, write control circuit 35 sets write control signals WDTB and /WDTB respectively to "H" level and "L" level according to input data DIN (for example "0" data).

Accordingly, transistor Tb and transistor Te are activated. Further, in the fourth modification of the first embodiment, control signals WAS and AS are both set to "H" level when data is written. Namely, gate transistor SG# and transistor Tf of bit line driver unit BLDa are activated. When transistor Te of bit line driver unit BLDb is turned on, power supply voltage VDD and node Nc are electrically coupled. When gate transistor SG# is activated, the other end of bit line BL and bit line driver unit BLDb are electrically coupled. When transistor Tf of bit line driver unit BLDa is activated, ground voltage GND and node Nb are electrically coupled. In contrast, when transistor Tb of source line driver SLD is activated, ground voltage GND and node Na are electrically coupled.

The other end of bit line BL is at a high potential, one end thereof is at a low potential, and source line SL is at a low potential. Thus, from the other end to one end of bit line BL, a current path is formed. Further, a current path is formed via tunneling magneto-resistance element TMR, access transistor ATR, source line SL and data line RD. Namely, two current paths are formed.

According to input data DIN (for example "1" data), write control circuit 35 sets write control signals WDTA and /WDTA to "H" level and "L" level, respectively. Accordingly, transistor Ta and transistor Tf are activated. Accordingly, power supply voltage VDD and node Na are electrically coupled and ground voltage GND and node Nb are electrically coupled.

A current path is thus formed from source line SL to bit line BL via access transistor ATR and tunneling magneto-resistive element TMR. Since node Nb of bit line driver unit BLDa provided on one end of bit line BL is electrically coupled with ground voltage GND as described above, the direction of the current path formed for bit line BL is identical.

In other words, the method of writing data in the fourth modification of the first embodiment provides the data write current that flows from the other end to one end of bit line BL for writing any input data DIN.

In connection with FIGS. 15A and 15B, a description is given of the case where the data write current flows from the other end to one end of bit line BL in the fourth modification of the first embodiment.

Referring to FIG. 15A, in the case where a current path is formed from the other end to one end of bit line BL as described above, a magnetic field Has is applied to the tunneling magneto-resistance element when it is supposed here that passing current Ias flows. The configuration in the fourth modification of the first embodiment is described as applied to the case where an assist magnetic field generated by the passing current flowing in bit line BL is further used to write data. Regarding this configuration, it is supposed that a current path is formed so that magnetic field Has is applied in the opposite direction to the magnetization direction of pinned layer PL of memory cell MC.

FIG. 15B shows memory cells MC0 to MC2 described in connection with FIG. 6B.

In this case, regarding memory cell MC0 for example, pinned layer PL and free layer FL are in parallel with each other and assist magnetic field Has is applied in the opposite direction to the magnetization direction of pinned layer PL.

Figure 16A:
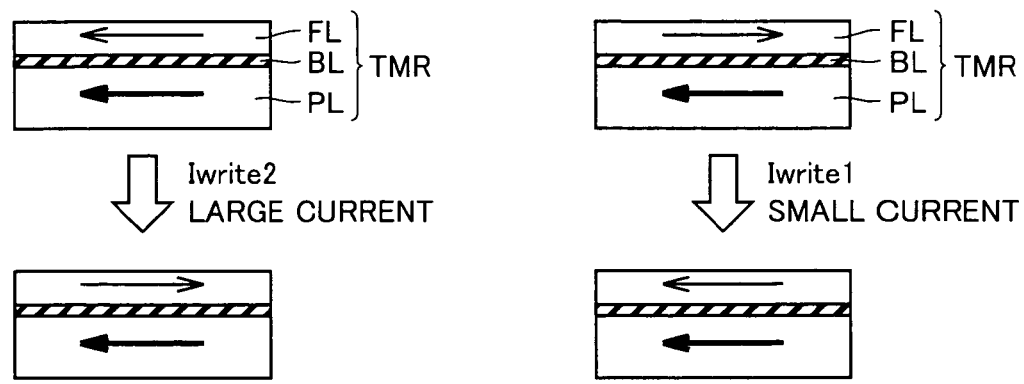
FIGS. 16A and 16B illustrate how data is written using an assist magnetic field according to the fourth modification of the first embodiment of the present invention.
Figure 16B:
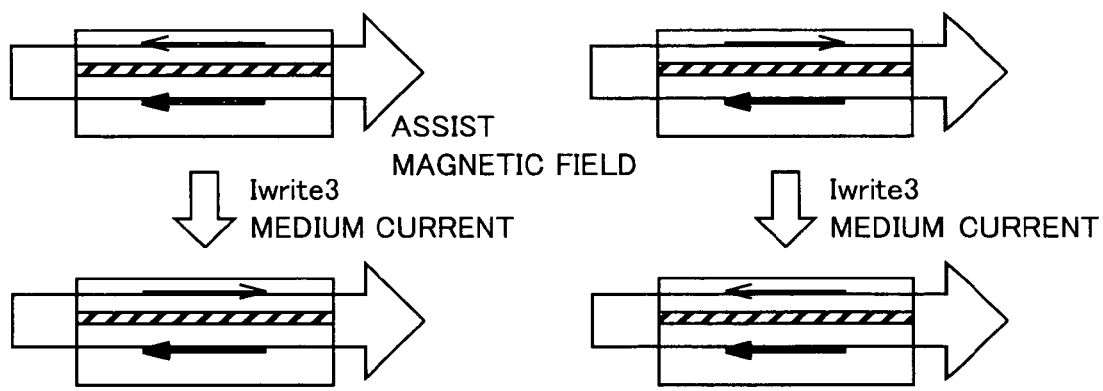

In connection with FIGS. 16A and 16B, a description is given of the case where data is written by means of the assist magnetic field in the fourth modification of the first embodiment.

Referring to FIG. 16A, in the case where respective magnetization directions of pinned layer PL and free layer FL are to be made opposite to each other, namely a change is made to a high-resistance state, it is necessary to supply data write current Iwrite2 larger than data write current Iwrite1 as described above. Further, in order to change the magnetization direction so that respective directions of magnetization of pinned layer PL and free layer FL are parallel with each other, namely to make a change to a low-resistance state, it is necessary to supply data write current Iwrite1 as described above.

In the present example, when data is to be written, data write current Iwrite3 having a current value intermediate between data write current Iwrite1 and data write current Iwrite2 is supplied.

In this case, as shown in FIG. 16B, in order to cause opposite magnetization directions respectively of pinned layer PL and free layer FL, namely to make a change to a high-resistance state, for example, data write current Iwrite2 larger than data write current Iwrite1 has to be supplied. However, in addition to data write current Iwrite3, assist magnetic field Has is used for reversing the magnetization direction of free layer FL relative to the magnetization direction of pinned layer PL. Thus, respective directions of magnetization of pinned layer PL and free layer FL can be made opposite to each other (antiparallel), namely a change can be made to a high-resistance state.

In contrast, in the case for example where respective directions of magnetization of pinned layer PL and free layer FL are made identical to each other, namely a change to a low-resistance state is made, it is necessary to supply data write current Iwrite1. However, since assist magnetic field Has serves to make the directions of magnetization of pinned layer PL and free layer FL opposite to each other. Therefore, data write current Iwrite3 larger than data write current Iwrite1 can be supplied to provide the same magnetization directions of pinned layer PL and free layer FL (parallel state), namely a change can be made to a low-resistance state, even in the presence of assist magnetic field Has.

In other words, for writing data in the fourth modification of the first embodiment, an assist magnetic field can be applied in any of the cases of the data writing so as to set data write current Iwrite3 between data write currents Iwrite1 and Iwrite2, and thus it is unnecessary to adjust the size of transistors (driver transistors) of bit line driver BLD and source line driver SLD for generating such different data write currents as data write currents Iwrite1 and Iwrite2 as described above in connection with the first embodiment, and design can be prepared with the same size. Therefore, drivers can be produced easily.

The method using bit line BL to apply assist magnetic field Has is described herein. However, the method is not limited to this and it is clearly seen that, for example, source line SL may be used to apply an assist magnetic field. In stead of bit line BL or source line SL, other current lines can newly be provided for generating a magnetic field.

Second Embodiment

The first embodiment has been described regarding the case where source line SL and sense amplifier SA are electrically coupled to supply the data read current for the purpose of suppressing read disturb. In contrast, according to a second embodiment of the present invention, a description is given of the case where read disturb is further suppressed.

For a state of a resistance difference between a low-resistance state and a high-resistance state of a memory cell MC, MR ratio has conventionally been used as a general index. Specifically, for a resistance value Rmin of a tunneling magneto-resistance element (TMR) of "0" data corresponding to a low-resistance state and a resistance value Rmax of the tunneling magneto-resistance element (TMR) of "1" data corresponding to a high-resistance state, the MR ratio is defined as MR ratio=(Rmax−Rmin)/Rmin×100(%). In order to sufficiently provide an operating margin, it is desirable that this value is 10 to 20%.

However, in recent years, the MR ratio has remarkably been improved and some memory cells MC have an MR ratio of 100% or higher. Specifically, it has been reported for example that the material for a barrier layer BAL as described above is selected so that remarkable advantages are obtained ("Giant tunneling magnetoresistance at room temperature with MgO (100) tunnel barriers", nature materials, ADVANCE ONLINE PUBLICATION, www.nature.com/naturematerials 2004 Nature Publishing Group, Published online: 31 Oct. 2004; doi: 10.1038/nmat1256).

If the MR ratio is high, the data read current differs greatly depending on a high-resistance state and a low-resistance state. In the present example, a data read current flowing in the high-resistance state (Rmax) is represented as Iread1 and a data read current flowing in the low-resistance state (Rmin) is represented as Iread2 (>Iread1) for the description here.

Thus, in terms of the inversion of the magnetization direction of memory cell MC as described in connection with FIGS. 5A and 5B, if the data read current is applied from free layer FL to pinned layer PL for example, there is a higher possibility of read disturb in the case where a transition is made from the high-resistance state (Rmax) to the low-resistance state (Rmin).

This is because of the reason that data read current Iread1 flows in the same direction as data write current Iwrite1 as shown in FIG. 5A. In this case, data write current Iwrite1 is a current smaller than data write current Iwrite2 as described above and thus, depending on a difference in current between data write current Iwrite1 and data read current Iread1, there could be influences of real disturb. However, if the MR ratio is extremely high, data read current Iread1 flowing in the high-resistance state (Rmax) is extremely small.

In contrast, if the data read current is applied from pinned layer PL to free layer FL for example, there is a higher possibility of read disturb in the case where a transition is made from the low-resistance state (Rmin) to the high-resistance state (Rmax). This is also for the reason that, in this case, data read current Iread2 flows in the same direction as data write current Iwrite2 as shown in FIG. 5B. In this case, since data read current Iread2 is smaller than data write current Iwrite1 (<Iwrite2), the possibility of read disturb will be low. However, if the MR ratio is extremely high, data read current Iread2 flowing in the low-resistance state (Rmin) is extremely large as compared with data read current Iread1 in the high-resistance state, so that data read Iread2 could be closer to data write current Iwrite2.

In connection with the second embodiment of the present invention, a description is given of a method that can further suppress, according to the MR ratio, read disturb in reading data that could occur depending on the data read current. In the second embodiment of the present invention, a comparison is made between the MR ratio and the ratio of data write current Iwrite2 to data write current Iwrite1 (the ratio is also referred to as Iw ratio). If there is the relation MR ratio≧Iw ratio, the data read current is applied to flow from free layer FL to pinned layer PL. If there is the relation MR<Iw ratio, the data read current is applied to flow from pinned layer PL to free layer FL. Here, a description is given of the case where the data read current for memory cell MC greatly varies between a high-resistance state and a low-resistance state, namely the MR ratio is high (MR ratio≧Iw ratio).

Figure 17:
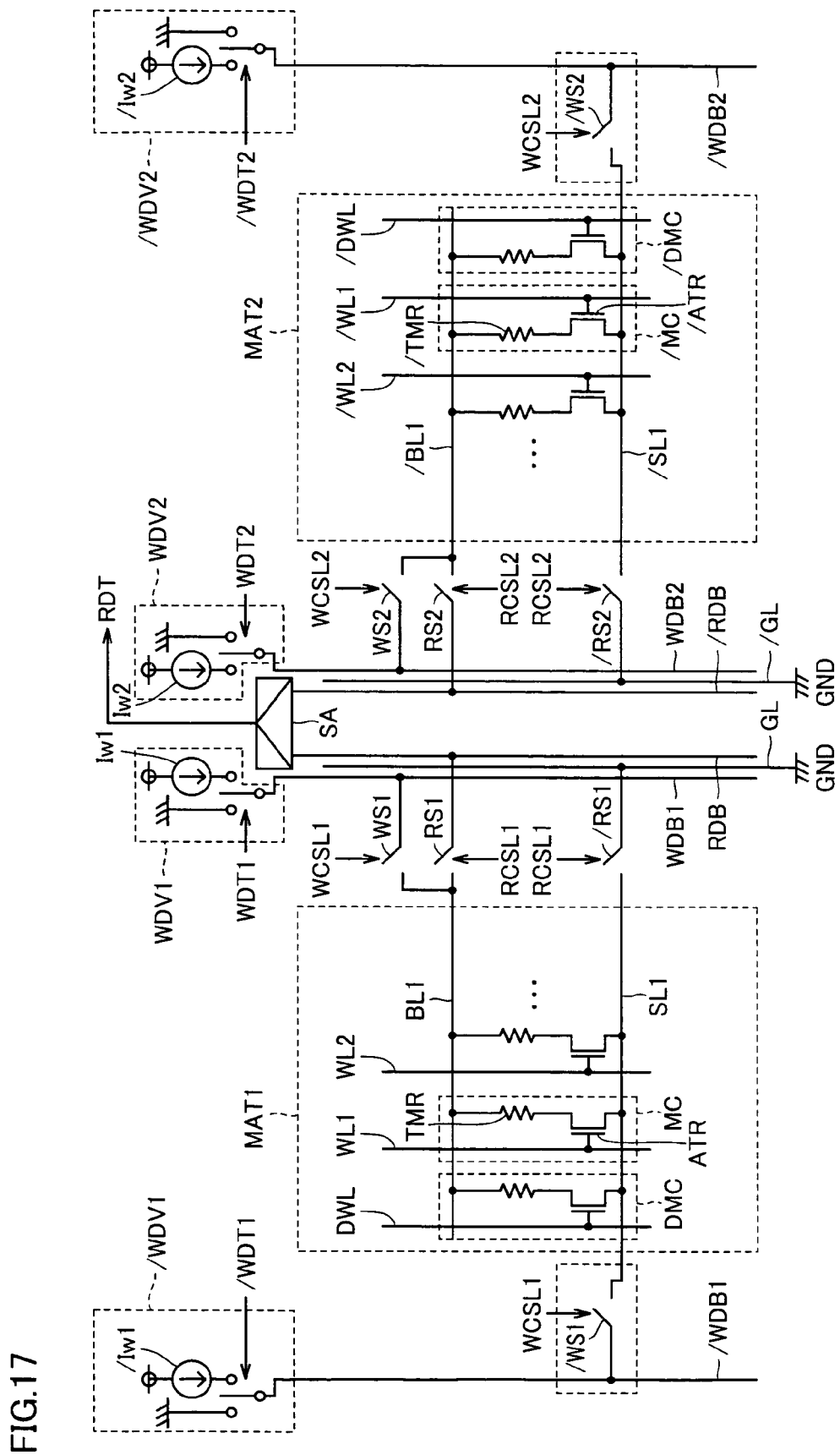
FIG. 17 is a conceptual diagram of a memory array and its peripheral circuitry according to a second embodiment of the present invention.

In connection with FIG. 17, a description is given of a memory array and its peripheral circuitry according to the second embodiment of the present invention.

Referring to FIG. 17, the memory array in the second embodiment of the present invention is divided into a plurality of memory mats. Here, as one example, the memory array divided into two memory mats MAT1, MAT2 is shown.

Memory mats MAT1, MAT2 each include memory cells MC arranged in integrated manner in rows and columns and a plurality of dummy memory cells DMC to be compared with memory cells MC.

A plurality of dummy memory cells DMC are provided one by one to share a memory cell column. With this configuration, dummy memory cells can efficiently be arranged and the area of the memory array can be reduced.

In memory mat MAT1, a plurality of word lines WL are provided correspondingly to memory cell rows respectively. In the present example, word lines WLi (i is a natural number) provided correspondingly to memory cells MC and a word line DML provided correspondingly to dummy memory cell DMC are shown.

In memory mat MAT2, a plurality of word lines /WL are provided correspondingly to memory cell rows, respectively. In the present example, word lines /WLi provided correspondingly to memory cells MC and a word line /DML provided correspondingly to dummy memory cell DMC are shown.

Further, bit lines BL and source lines SL are provided correspondingly to memory cell columns. Specifically, in memory mat MAT1, a bit line BL1 and a source line SL1 are shown. Further, in memory mat MAT2, a bit line /BL1 and a source line /SL1 are shown. Bit lines BL1, /BL1 constitute a pair of bit lines. Source lines SL1, /SL1 constitute a pair of source lines.

On one end of a bit line and on one end and the other end of a source line, gate switches are provided respectively. For example, on one end of bit line BL1, a gate switch WS1 and a gate switch RS1 are provided in parallel. On one end and the other end of source line SL1, a gate switch /WS1 and a gate switch /RS1 are provided respectively.

Further, on one end of bit line /BL1, a gate switch WS2 and a gate switch RS2 are provided in parallel. On one end and the other end of source line /SL1, a gate switch /WS2 and a gate switch /RS2 are provided respectively. Gate switches WS1 and /WS1 are activated in response to input of write column select signal WCSL1. Gate switches RS1, /RS1 are activated in response to input of read column select signal RCSL1. Gate switches WS2, /WS2 are activated in response to input of write column select signal WCSL2. Gate switches RS2, /RS2 are activated in response to input of read column select signal RCSL2.

Write data buses WDB1, /WDB1 are provided correspondingly to memory mat MAT1. Similarly, write data buses WDB2, /WDB2 are provided correspondingly to memory mat MAT2. Write data bus WDB1, /WDB1 are electrically coupled respectively with one end of bit line BL1 and one end of source line SL1 via gate switches WS1, /WS1 respectively. Write data bus WDB2, /WDB2 are electrically coupled with one end of bit line /BL1 and one end of source line /SL1 via gate switches WS2, /WS2 respectively.

Read data buses RDB, /RDB electrically coupled with sense amplifier SA are provided correspondingly to memory mats MAT1, MAT2, respectively. Further, ground lines GL, /GL connected fixedly to ground voltage GND are provided. Read data buses RDB, /RDB are electrically coupled with one end of bit line BL1 and one end of bit line BL2 via gate switches RS1, RS2 respectively. Ground lines GL, /GL are electrically coupled with the other end of source line SL1 and the other end of source line SL2 via gate switches /RS1, /RS2 respectively.

Further, write drivers WDV1, /WDV1 are provided correspondingly to write data buses WDB1, /WDB1 respectively. Write drivers WDV1, /WDV1 operate according to write control signals WDT1, /WDT1 that are input when data is to be written. For example, in the case where write control signals WDT1 and /WDT1 are "H" level and "L" level respectively, write data buses WDB1 and /WDB1 are electrically coupled with a constant current source Iw1 and ground voltage GND respectively. In the case where write control signals WDT1 and /WDT1 are "L" level and "H" level respectively, write data buses WDB1 and /WDB1 are electrically coupled with ground voltage GND and a constant current source /Iw1 respectively.

Similarly, correspondingly to write data buses WDB2, /WDB2, write drivers WDV2, /WDV2 are provided respectively.

Further, for supplying the data write current to memory mats MAT1, MAT2, constant current sources Iw1, /Iw1, Iw2 and /Iw2 are provided. Here, constant current source Iw1 supplies the data write current from bit line BL to source line SL. Constant current source /Iw1 supplies the data write current from source line SL to bit line BL. Constant current sources Iw2, /Iw2 supply the data write current in similar manner.

Write drivers WDV2, /WDV2 operate according to write control signals WDT2, /WDT2 that are input when data is to be written. For example, in the case where write control signals WDT2 and /WDT2 are "H" level and "L" level respectively, write data buses WDB2 and /WDB2 are electrically coupled with constant current source Iw2 and ground voltage GND respectively. In the case where write control signals WDT2 and /WDT2 are "L" level and "H" level respectively, write data buses WDB2 and /WDB2 are electrically coupled with ground voltage GND and constant current source /Iw2 respectively.

In the memory array, a write column select line for transmitting write column select signal WCSL when data is to be written as well as a read column select line for transmitting read column select signal RCSL when data is to be read are provided (not shown).

In this configuration, sense amplifier SA is electrically coupled with read data buses RDB, /RDB to generate read data RDT according to a difference in passing current of read data buses RDB, /RDB.

Figure 18:
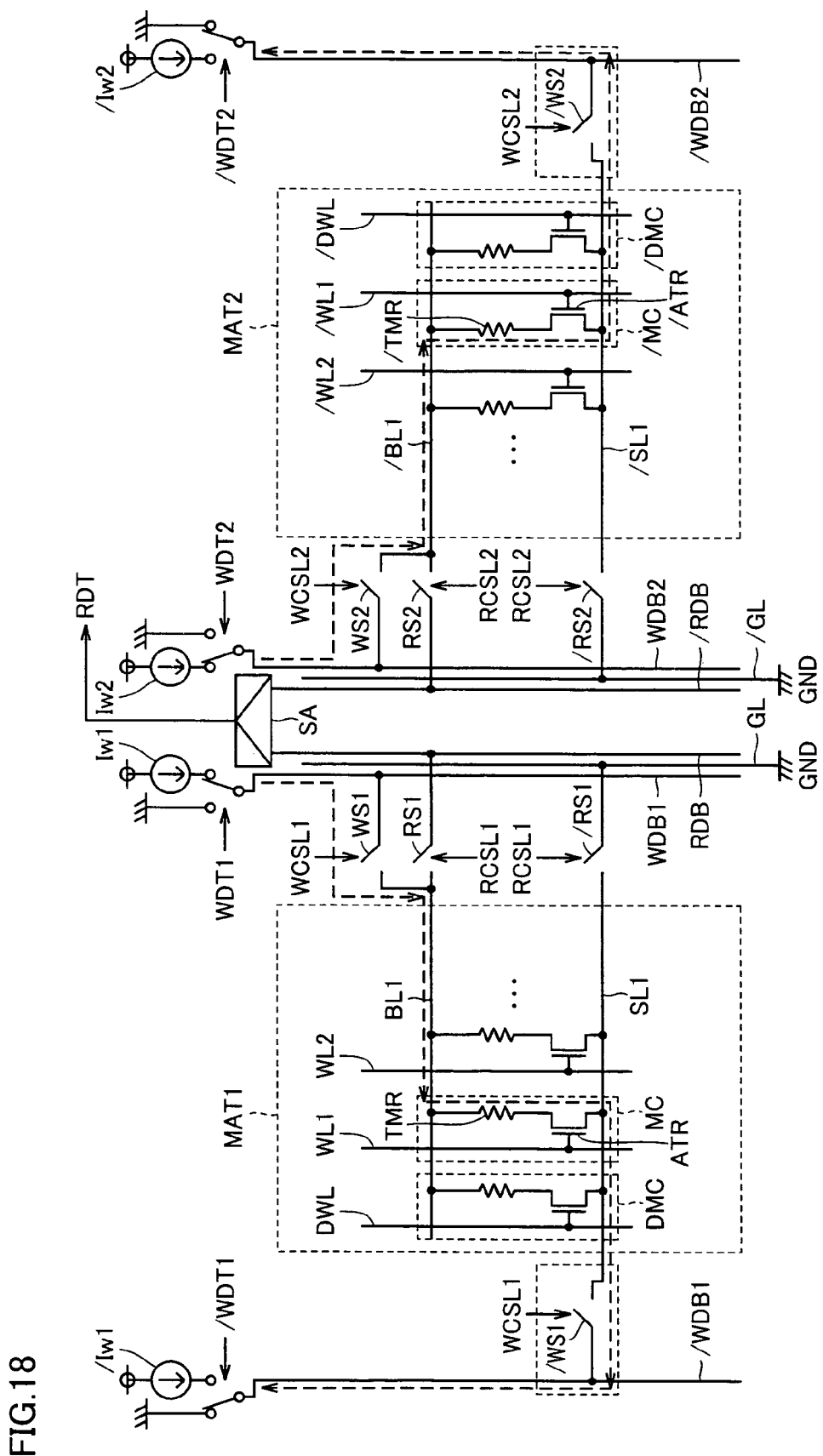
FIG. 18 illustrates how data is written to a memory cell.

In connection with FIG. 18, a description is given of how data is written to memory cells MC and /MC.

Referring to FIG. 18, in the case where input data DIN which is "0" data is input, in memory mat MAT1, a write control circuit (not shown) sets write control signals WDT1 and /WDT1 to "H" level and "L" level respectively. In response to this, write driver WDV1 electrically couples constant current source Iw1 with write data bus WDB1 as described above. Further, write column select signal WCSL1 is set to "H" level. Write driver /WDV1 electrically couples ground voltage GND with write data bus /WDB1. Thus, gate switch WS1 is activated so that write data bus WDB1 and bit line BL1 are electrically coupled. Gate switch /WS1 is activated so that write data bus /WDB1 and source line SL1 are electrically coupled.

Further, word line WL1 is activated. Accordingly, a current path of constant current source Iw1, write data bus WDB1, gate switch WS1, bit line BL1, memory cell MC, source line SL1, gate switch /WS1, write data bus /WDB1 and ground voltage GND is formed. In other words, the data write current flows for selected memory cell MC from free layer FL to pinned layer PL. In this case, constant current source Iw1 supplies data write current Iwrite1.

In the case where input data DIN which is "1" data is input, the direction of the data write current is reversed. Specifically, a current path of constant current source /Iw1, write data bus /WDB1, gate switch /WS1, source line SL1, memory cell MC, bit line BL1, gate switch WS1, write data bus WDB1 and ground voltage GND is formed. In other words, for selected memory cell MC, the data write current flows from pinned layer PL to free layer FL. In this case, constant current source /Iw1 supplies data write current Iwrite2.

For memory mat MAT2, data is written in a similar manner.

A description is next given of how data is read from memory cell MC.

In the case where memory mat MAT1 is selected, in memory mat MAT2, dummy memory cell /DMC is selected and a reference current Iref to be compared by sense amplifier SA is generated. In contrast, in the case where memory mat MAT2 is selected, in memory mat MAT1, dummy memory cell DMC is selected and reference current Iref is generated.

Figure 19:
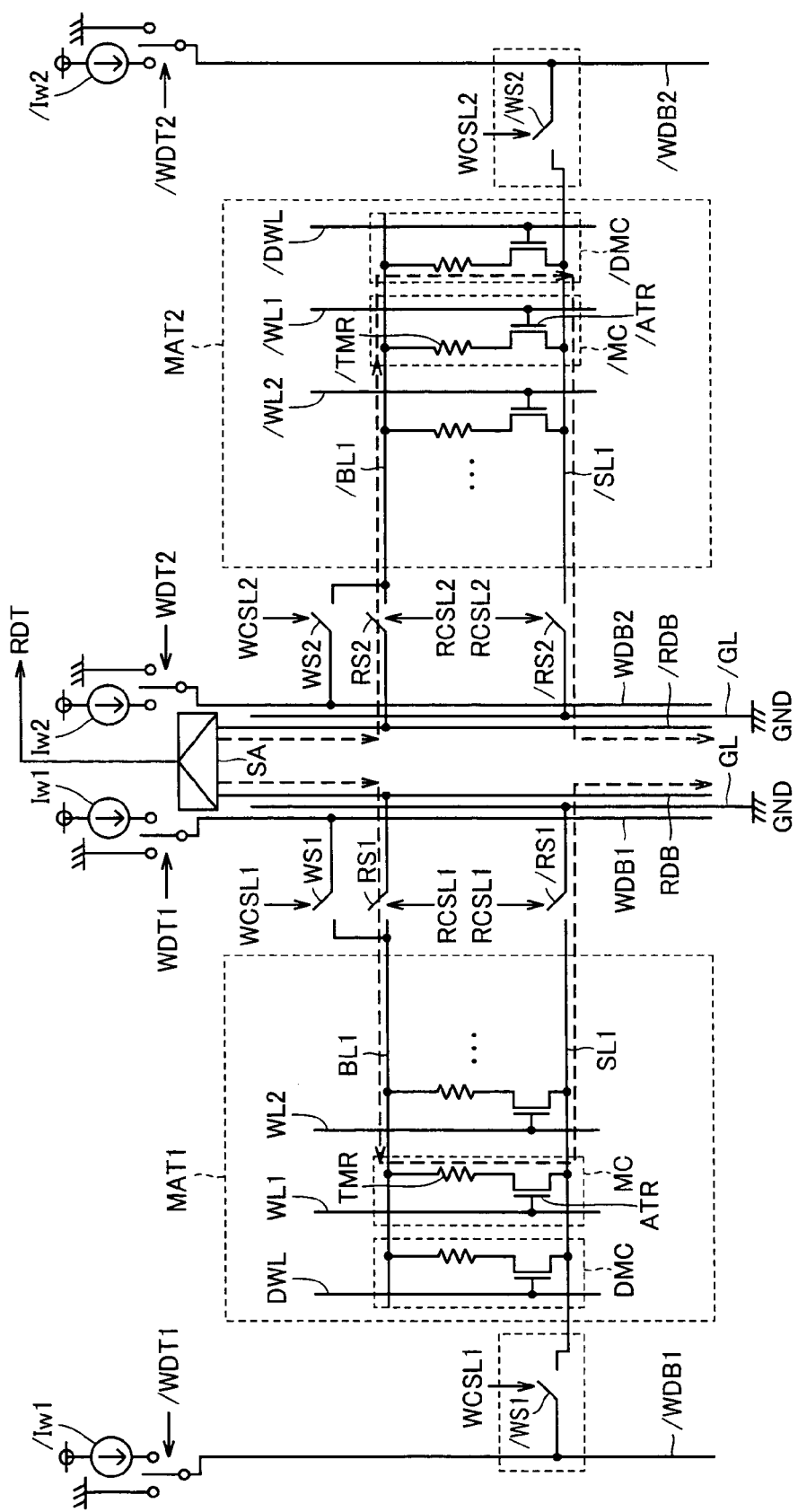
FIG. 19 illustrates how data is read from a memory cell of a memory mat.

In connection with FIG. 19, how data is read from memory cell MC of memory mat MAT1 is described.

Referring to FIG. 19, in the case where memory cell MC is selected as a memory cell from which data is to be read, dummy memory cell /DMC of memory mat MAT2 is selected as described above.

Specifically, read column select signals RCSL1, RCSL2 are set to "H" level. Accordingly, read data bus RDB and bit line BL1 are electrically coupled. Further, source line SL1 and ground line GL are electrically coupled. Read data bus /RDB and bit line /BL1 are electrically coupled. Further, source line /SL1 and ground line /GL are electrically coupled. Word line WL1 and dummy word line /DWL are electrically coupled.

Accordingly, for selected memory cell MC, a current path of sense amplifier SA, read data bus RDB, gate switch RS1, bit line BL1, memory cell MC, source line SL1, gate switch /RS1, and ground line GL is formed. Namely, the data read current flows for selected memory cell MC from free layer FL to pinned layer PL. Further, for dummy memory cell /DMC, a current path of sense amplifier SA, read data bus /RDB, gate switch RS2, bit line /BL1, dummy memory cell DMC, source line /SL1, gate switch /RS2, and ground line /GL is formed. Here, dummy memory cell DMC is set to an intermediate value between the high-resistance state Rmax and the low-resistance state Rmin and reference current Iref to be compared is supplied to read data bus /RDB based on the resistance value.

Based on the comparison with the reference current, sense amplifier SA outputs read data RDT.

In the present example, the case is shown where the MR ratio is high, namely there is the relation MR ratio≧Iw ratio and sense amplifier SA allows the data read current to flow from free layer FL to pinned layer PL.

As described above, in the case where there is the relation MR ratio≧Iw ratio namely the MR ratio is considerably high, the data read current is applied from free layer FL to pinned layer PL. In this case, depending on a difference in current between data write current Iwrite1 and data read current Iread1, there could be influences of read disturb. However, if the MR ratio is extremely high, data read current Iread1 flowing in the high-resistance state (Rmax) is extremely small. In contrast, data read current Iread2 flowing in the low-resistance state (Rmin) is extremely large.

Therefore, in the case where the MR ratio is extremely high, the ratio between data write current Iwrite1 and data read current Iread1 applied from free layer FL to pinned layer PL (represented as Iwrite1/Iread1=Iwr1 ratio) and the ratio between data write current Iwrite2 and data read current Iread2 applied from pinned layer PL to free layer FL (represented as Iwrite2/Iread2=Iwr2 ratio) as compared with each other have the relation Iwr1 ratio≧Iwr2 ratio. Thus, in the case where the data read current is applied from free layer FL to pinned layer PL, the current difference can more sufficiently be ensured and accordingly the read disturb can further be suppressed.

In contrast, in the case where there is the relation MR ratio<Iw ratio, namely the MR ratio is lower, the data read current is applied from pinned layer PL to free layer FL as described in connection with the first embodiment. In this case, depending on a difference in current between data write current Iwrite2 and data read current Iread2, there could be influences of read disturb. However, it does not occur that data read current Iread2 for a low MR ratio is excessively large. In other words, the ratio between data write current Iwrite2 and data read current Iread2 applied from pinned layer PL to free layer FL, which is represented as Iwr2 ratio, and the ratio between data write current Iwrite1 and data read current Iread1 applied from free layer FL to pinned layer PL, which is represented as Iwr1, as compared with each other have the relation Iwr2 ratio≧Iwr1 ratio. Thus, in the case where the data read current is applied from pinned layer PL to free layer FL, the current difference can more sufficiently be ensured and read disturb can further be suppressed.

With the configuration here, in the two memory mats, different paths can be provided to flow the data read current flowing through the memory cell and the reference current. By the distributed currents in data reading, read disturb of a selected memory cell can be suppressed.

Modification of Second Embodiment

A description is given of a method of executing high-speed data reading in a modification of the second embodiment of the present invention.

Figure 20:
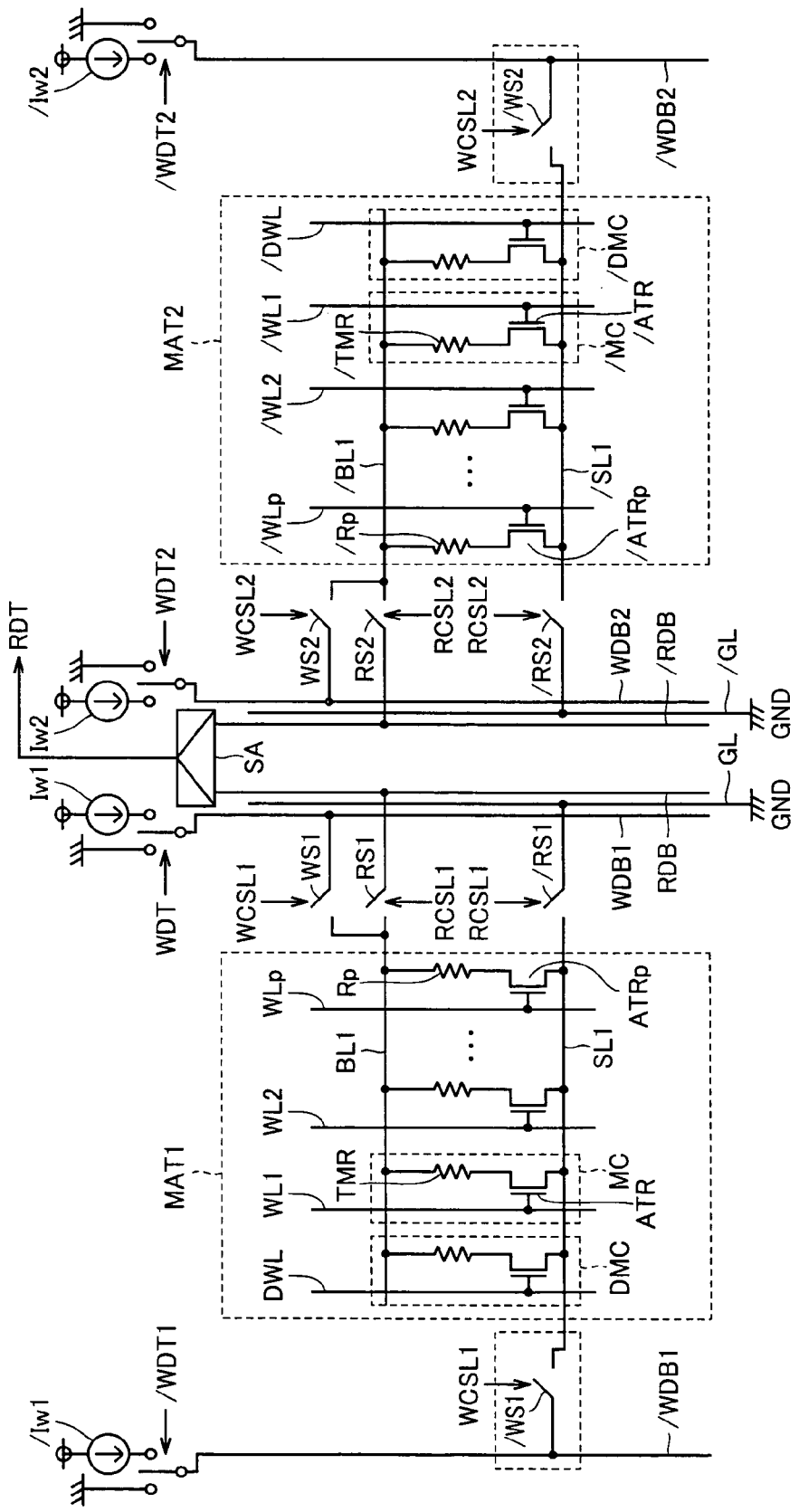
FIG. 20 is a conceptual diagram of a memory array and its peripheral circuitry according to a modification of the second embodiment of the present invention.

Referring to FIG. 20, the schematic diagram of a memory array and its peripheral circuitry in the modification of the second embodiment differs from the configuration in FIG. 17 in that memory mats MAT1, MAT2 are provided with dummy resistances Rp, /Rp and dummy transistors ATRp, /ATRp that share a memory cell column. Specifically, dummy resistance Rp and dummy transistor ATRp are connected in series between bit line BL1 and source line SL1. Dummy resistance /Rp and dummy transistor /ATRp are connected in series between bit line /BL1 and source line /SL1. A further difference is that dummy word lines WLp, /WLp that are electrically coupled with the gates of dummy transistors ATRp, /ATRp are provided.

In the case where dummy word line WLp is activated, dummy resistance Rp is electrically coupled via dummy transistor ATRp between bit line BL1 and source line SL1. Similarly, in the case where dummy word line /WLp is activated, dummy resistance /Rp is electrically coupled via dummy transistor /ATRp between bit line /BL1 and source line /SL1.

A method of reading data in the modification of the second embodiment is described.

In the present example, in the case where memory mat MAT1 is selected, if memory cell MC for example is selected, dummy word line WLp is activated. Thus, between bit line BL1 and source line SL1, dummy resistance Rp is also connected in parallel with tunneling magneto-resistance element TMR. In the case where memory mat MAT2 is selected, similarly dummy word line /WLp is activated. Thus, between bit line /BL1 and source line /SL1, dummy resistance /Rp is also connected in parallel with tunneling magneto-resistance element /TMR.

It is supposed for example that dummy resistance Rp is set to a low-resistance state Rmin of the memory cell. It is further supposed here that the high-resistance state Rmax and the low-resistance state Rmin as compared with each other provide an extremely high MR ratio and there is the relation Rmax>>Rmin.

In the case where data is read from memory cell MC of memory mat MAT1, word line WL1 and dummy word line WLp are activated. Then, if memory cell MC has its resistance value in the low-resistance state Rmin, the combined resistance with dummy resistance Rp is Rmin/2. Thus, sense amplifier SA supplies a data read current according to the combined resistance. Therefore, the data read current increases so that fast sensing operation can be performed. In this case as well, since the data read current passing through selected memory cell MC has is current value that does not change, the possibility of read disturb does not become high.

In the case where memory cell MC has its resistance value in the high-resistance state Rmax, the combined resistance is close to Rmin. Here, there is the relation Rmax >>Rmin.

Therefore, in the case where the resistance value of dummy resistance Rp is set to Rmin, the resistance value of dummy memory cell DMC of memory mat MAT2 is set to 3Rmin/4 which is an intermediate value between the combined resistance Rmin/2 and Rmin. In this case, the difference in resistance $\Delta R$ is Rmin/4 and, according to this value, a difference in passing current is generated.

Further, in the case where the resistance value of dummy resistance Rp is set to 2Rmin, if the resistance value of memory cell MC is in the low-resistance state Rmin, the combined resistance with dummy resistance Rp is 2Rmin/3. Here, if the resistance value of memory cell MC is in the high-resistance state Rmax, the combined resistance is close to 2Rmin. Here, there is the relation Rmax>>Rmin. Therefore, in the case where the resistance value of dummy resistance Rp is set to 2Rmin, the resistance value of dummy memory cell DMC of memory mat MAT2 is set to 4Rmin/3 which is an intermediate value between the combined resistance 2Rmin/3 and 2Rmin. In this case, the difference in resistance $\Delta R$ is 2Rmin/3 and, according to this value, a difference in passing current is generated. Thus, by increasing the resistance value of dummy resistance Rp, the data read margin increases.

Further, in the case where the resistance value of dummy resistance Rp is set to $\sqrt{2}$Rmin, if the resistance value of memory cell MC is in the low-resistance state Rmin, the combined resistance with dummy resistance Rp is Rmin/$\sqrt{2}$. If the resistance value of memory cell MC is in the high-resistances state Rmax, the combined resistance is close to $\sqrt{2}$Rmin. Here, there is the relation Rmax>>Rmin. Therefore, in the case where the resistance value of dummy resistance Rp is set to $\sqrt{2}$Rmin, the resistance value of dummy memory cell DMC of memory mat MAT2 is set to Rmin which is an intermediate value between the combined resistance Rmin$\sqrt{2}$ and $\sqrt{2}$Rmin. In this case, the difference in resistance $\Delta R$ is ($\sqrt{2}-1$)Rmin and, according to this value, a difference in passing current is generated.

In the case where the resistance value of dummy resistance Rp is set to N×Rmin, if the resistance value of memory cell MC is in the low-resistance state Rmin, the combined resistance with dummy resistance Rp is (N/(N+1))Rmin. If the resistance value of memory cell MC is in the high-resistance state Rmax, the combined resistance is close to N×Rmin. Here, there is the relation Rmax>>Rmin. Therefore, in the case where the resistance value of dummy resistance Rp is set to N×Rmin, the resistance value of dummy memory cell DMC of memory mat MAT2 is set to (N/2)×(N+2)/(N+1) Rmin which is an intermediate value between the combined resistance (N/(N+1)) Rmin and N×Rmin. In this case, the difference in resistance $\Delta R$ is (N/2)×N/(N+1) Rmin and, according to this value, a difference in passing current is generated.

As described above, the resistance value of dummy resistance Rp is increased and accordingly the data read margin is increased. Thus, while sufficiently ensuring data read margin, the voltage level of the power supply voltage is decreased to keep low the value of the data read current that directly flows through selected memory cell MC. Accordingly, read disturb can further be suppressed.

The description above is of the state where dummy resistance Rp is provided between bit line BL and source line SL so that it is connected in parallel with a selected memory cell MC. However, the state of connection is not limited to the above-described one, and the dummy cell may be connected in parallel with a memory cell MC selected in the state where it is connected with a read data bus RDB or /RDB.

The embodiments above have been described in connection with MRAM memory cells of the spin injection type. However, the present invention is not limited to the above-described one. The present invention is applicable as well to a memory cell of such a variable resistance memory device that applies current (voltage) to allow memory cell data to be rewritten, for example, RRAM (Resistance RAM).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile memory device, comprising:
   a plurality of memory cells arranged in rows and columns; and
   a plurality of first and second current lines provided correspondingly to memory cell columns respectively for supplying a current via a selected memory cell in data read operation or data write operation,
   said memory cells each including a magneto-resistance element provided between corresponding first and second current lines for executing magnetic nonvolatile data storage,
   said magneto-resistance element including
   a fixed magnetization layer electrically coupled with said corresponding first current line and magnetized in a first magnetization direction,
   a free magnetization layer electrically coupled with said corresponding second current line, and magnetized in one of said first magnetization direction and a second magnetization direction opposite to said first magnetization direction, based on spin-polarized electrons depending on a direction in which a data write current flows via said corresponding first and second current lines in said data write operation, and
   a barrier layer of a non-magnetic material provided between said fixed magnetization layer and said free magnetization layer, and
   said nonvolatile memory device further comprising a data read circuit supplying, in said data read operation, to the first and second current lines corresponding to said selected memory cell, a data read current in a direction in which disturb is unlikely to occur.

2. The nonvolatile memory device according to claim 1, wherein
   in a case where a first data write current is supplied via said selected memory cell from the corresponding first current line to the corresponding second current line in said data write operation, the magneto-resistance element of said selected memory cell has a first resistance value and, in a case where a second data write current smaller than said first data write current is supplied via said selected memory cell from said corresponding second current line to said corresponding first current line, the magneto-resistance element of said selected memory cell has a second resistance value smaller than said first resistance value, and said data read circuit supplies said data read current in said direction in which disturb is unlikely to occur, based on a relation between a resistance ratio between the first resistance value and the second resistance value of said magneto-resistance element and a current ratio between said first data write current and said second data write current.

3. The nonvolatile memory device according to claim 2, wherein said data read circuit includes a sense amplifier generating read data based on a comparison between a reference current and the data read current depending on said first resistance value and said second resistance value.

4. The nonvolatile memory device according to claim 3, further comprising a dummy resistance element electrically coupled between said corresponding first and second current lines in parallel with said selected memory cell in said data read operation.

5. The nonvolatile memory device according to claim 1, further comprising a plurality of word lines provided correspondingly to memory cell rows respectively, wherein said memory cells each include a switch connected via said magneto-resistance element between said corresponding first and second current lines, and said switch corresponds to a p-type MOS channel transistor having its gate electrically coupled with a corresponding word line.

6. The nonvolatile memory device according to claim 5, wherein a selected word line of said plurality of word lines is set to a first potential level causing said p-type MOS channel transistor to be turned on, and a non-selected word line of said plurality of word lines is set to a second potential level higher than said first potential level, causing said p-type MOS channel transistor to be turned off.

7. The nonvolatile memory device according to claim 1, wherein said plurality of first and second current lines are disposed in parallel in the same direction.

8. The nonvolatile memory device according to claim 1, wherein one of the first and second current lines corresponding to said selected memory cell in said data write operation or said data read operation is electrically coupled with a fixed potential, and the other of said corresponding first and second current lines is electrically coupled with a potential higher or lower than said fixed potential.

9. The nonvolatile memory device according to claim 1, further comprising first and second current line drivers provided correspondingly to said corresponding first and second current lines for supplying said data write current to said selected memory cell in said data write operation, at least one of said first and second current line drivers includes first and second driver units for controlling one end and the other end of a corresponding current line so that the one end and the other end of the current line are at first and second potential levels, and said first and second driver units control potential levels of the one end and the other end of said corresponding current line so that an assist magnetic field is applied that causes the free magnetization layer of said selected memory cell to be magnetized in one of said first and second magnetization directions by said data write current flowing through said corresponding current line in said data write operation.

10. A nonvolatile memory device, comprising:

a plurality of memory cells arranged in rows and columns; and a plurality of first and second current lines provided correspondingly to memory cell columns respectively for supplying a current via a selected memory cell in data read operation or data write operation, said memory cells each including a magneto-resistance element provided between corresponding first and second current lines for executing magnetic nonvolatile data storage, said magneto-resistance element including a fixed magnetization layer electrically coupled with said corresponding first current line and magnetized in a first magnetization direction, a free magnetization layer electrically coupled with said corresponding second current line, and magnetized in one of said first magnetization direction and a second magnetization direction opposite to said first magnetization direction, based on spin-polarized electrons depending on a direction in which a data write current flows via said corresponding first and second current lines in said data write operation, and a barrier layer of a non-magnetic material provided between said fixed magnetization layer and said free magnetization layer, and said nonvolatile memory device further comprising a data read circuit supplying, in said data read operation, to the first and second current lines corresponding to said selected memory cell, a data read current in the same direction as a direction that causes the free magnetization layer of said magneto-resistance element to be magnetized in said second magnetization direction in said data write operation.

* * * * *